(12) United States Patent
Yamamoto

(10) Patent No.: US 8,433,738 B2
(45) Date of Patent: Apr. 30, 2013

(54) FILTERING APPARATUS, FILTERING METHOD, PROGRAM, AND SURROUND PROCESSOR

(75) Inventor: Yuki Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 611 days.

(21) Appl. No.: 12/719,508

(22) Filed: Mar. 8, 2010

(65) Prior Publication Data

US 2010/0235419 A1 Sep. 16, 2010

(30) Foreign Application Priority Data

Mar. 13, 2009 (JP) .................................. 2009-060442

(51) Int. Cl.
*G06F 17/10* (2006.01)
*G06F 17/15* (2006.01)

(52) U.S. Cl.
USPC .......................................... 708/315; 708/420

(58) Field of Classification Search .................. 708/315, 708/319, 420, 421
See application file for complete search history.

(56) References Cited

U.S. PATENT DOCUMENTS

| 5,502,747 | A | * | 3/1996 | McGrath ........................ 375/350 |
| 5,809,069 | A | * | 9/1998 | Polley et al. ................... 375/222 |
| 7,206,350 | B2 | * | 4/2007 | Korobkov et al. ............. 375/260 |
| 7,251,271 | B1 | * | 7/2007 | Eriksson ........................ 375/229 |
| 2007/0297542 | A1 | * | 12/2007 | Sullivan ........................ 375/343 |

* cited by examiner

*Primary Examiner* — Chuong D Ngo
(74) *Attorney, Agent, or Firm* — Finnegan, Henderson, Farabow, Garrett & Dunner LLP

(57) ABSTRACT

A filtering apparatus for obtaining an output in a case where a discrete-time signal having a length of N (N is an integer) is input to an FIR filter with a filter coefficient having a length of M (M is an integer, N≧M−1), including: a division unit for dividing the discrete-time signal; a first zero padding unit for padding zero after the discrete-time signals; a first fast Fourier transform unit for performing FFT on the zero padded data; a second zero padding unit for padding zero after the filter coefficient; a second fast Fourier transform unit for performing FFT on the zero padded data; a multiplication unit for multiplying the frequency domain data by the frequency domain data; an inverse fast Fourier transform unit for performing IFFT on the multiplication results; and an adder unit for adding the discrete-time signals.

5 Claims, 13 Drawing Sheets

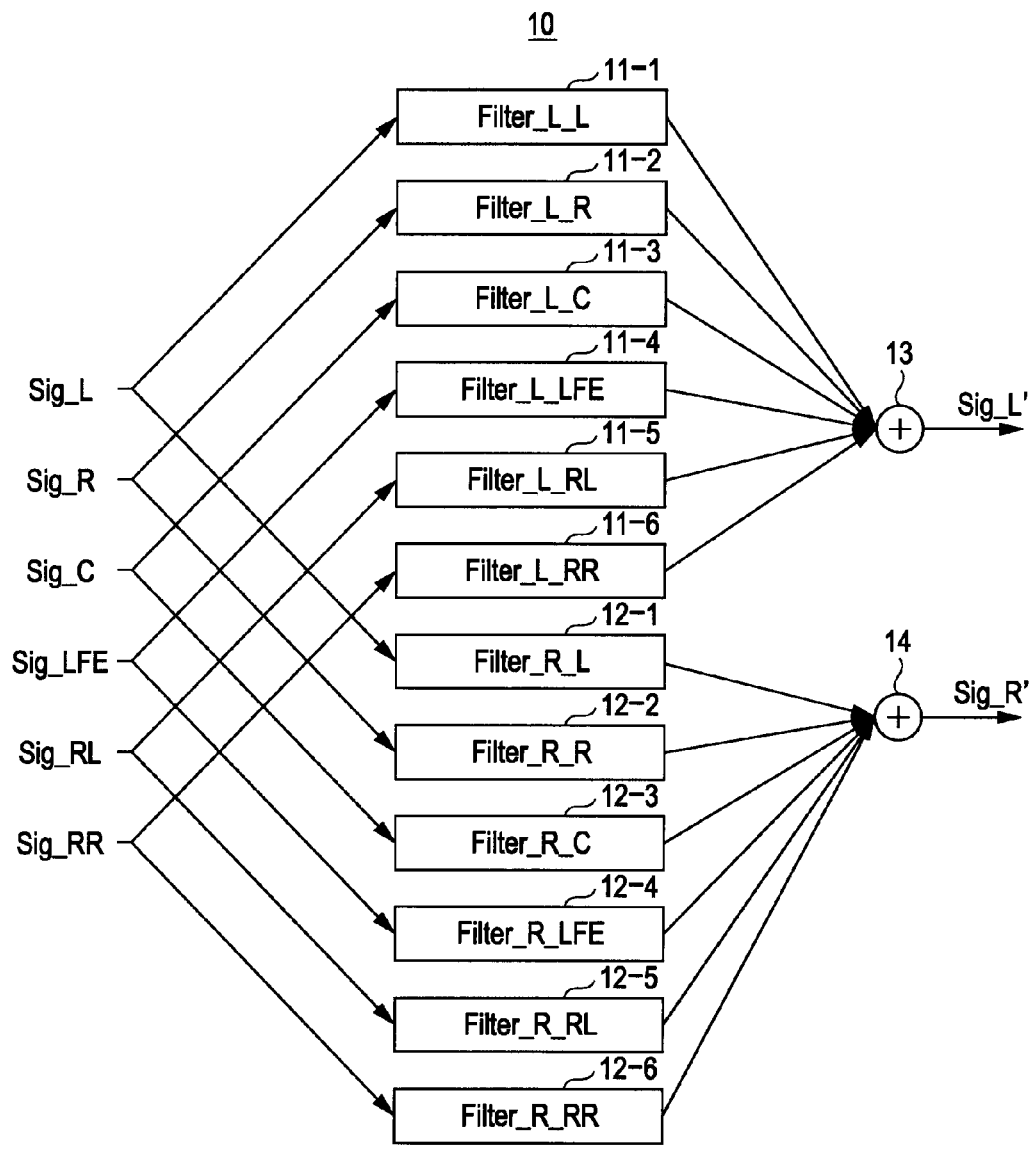

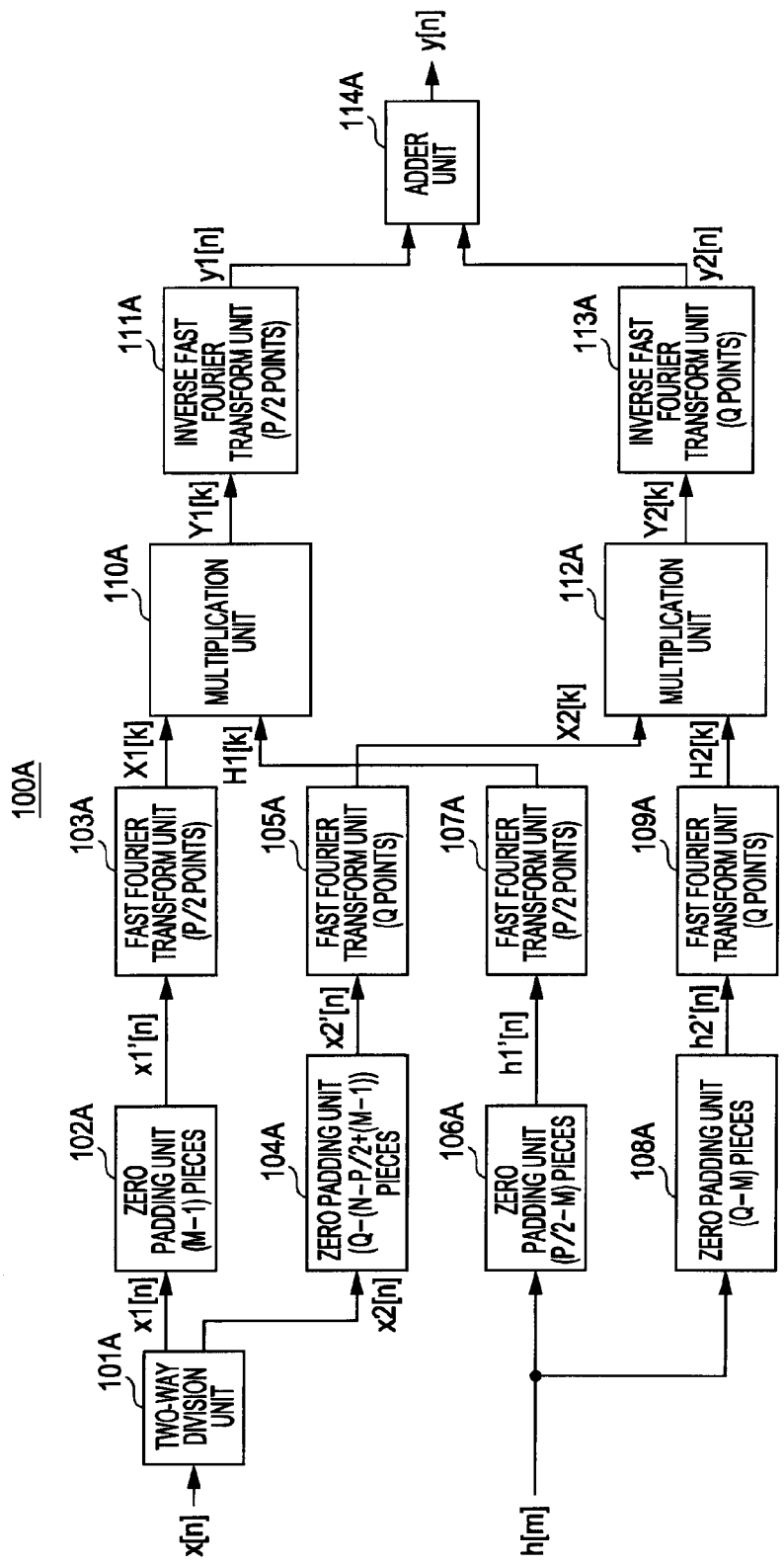

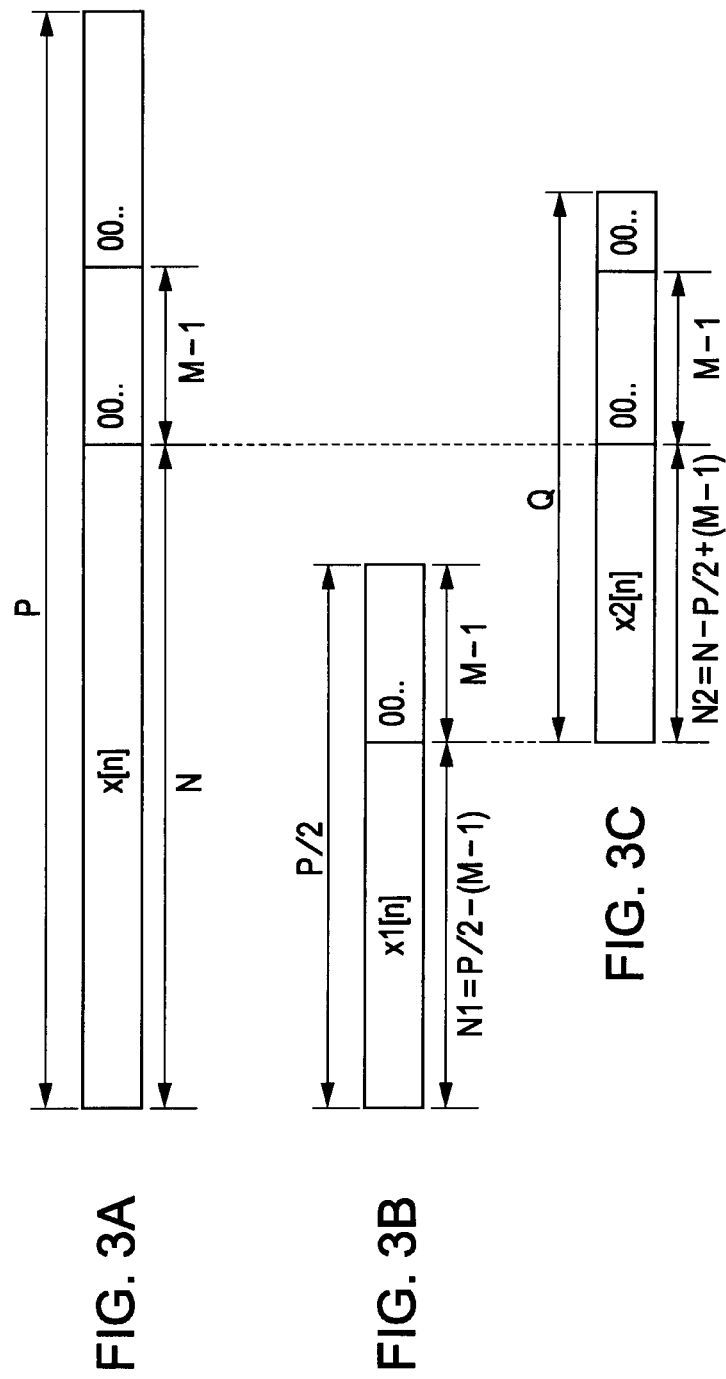

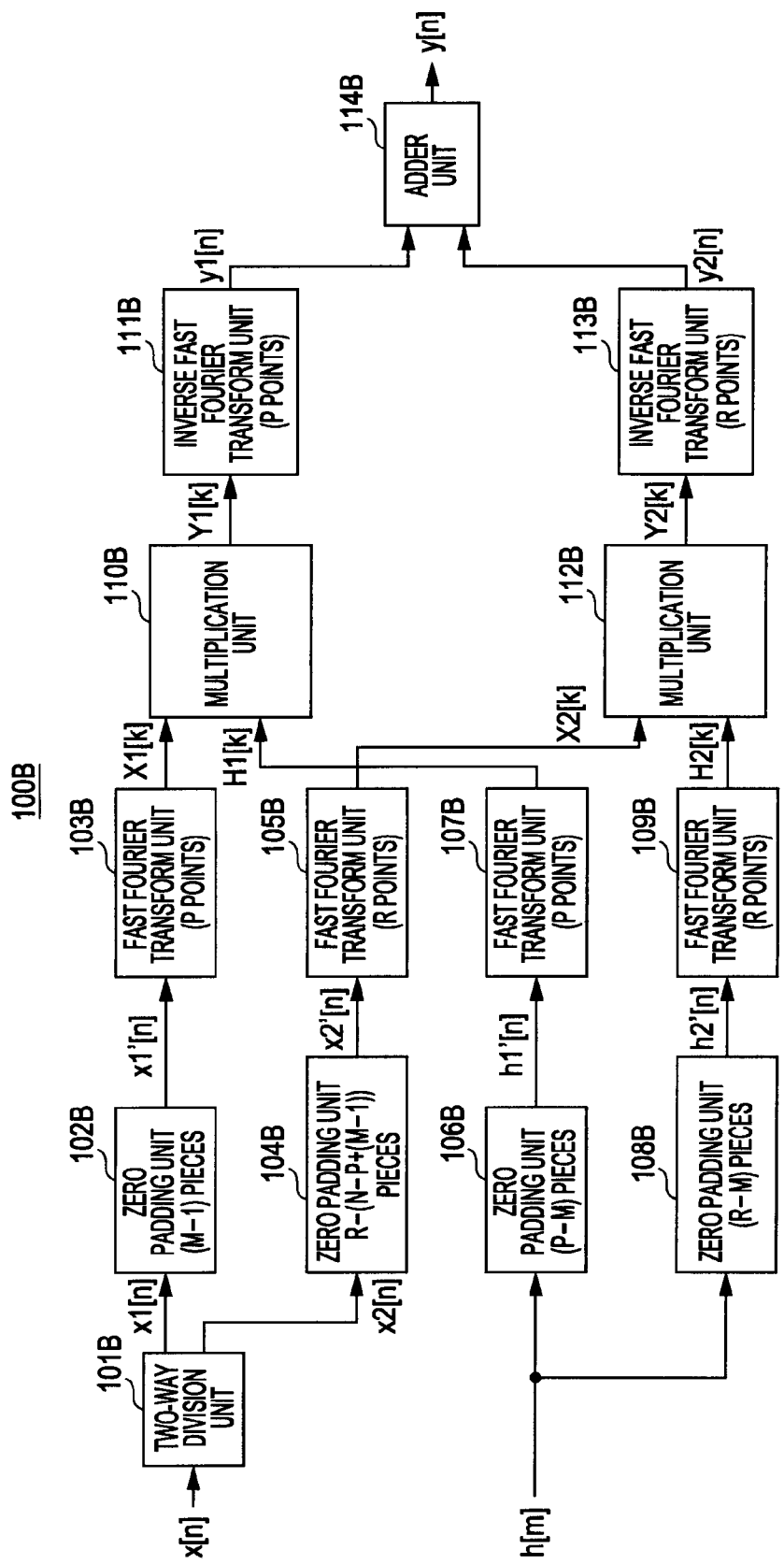

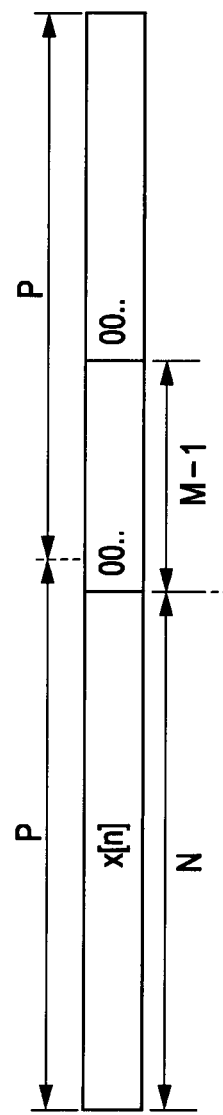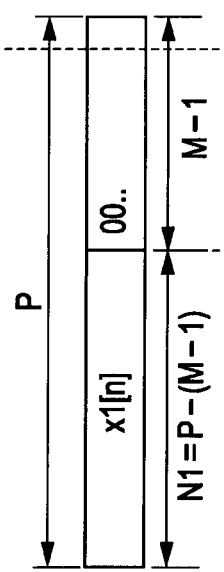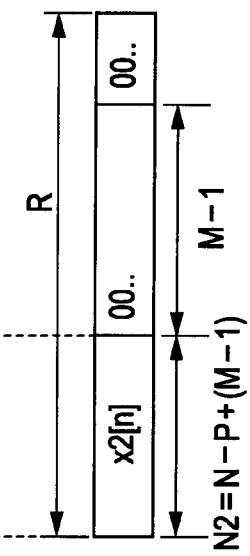
FIG. 5A
FIG. 5B
FIG. 5C

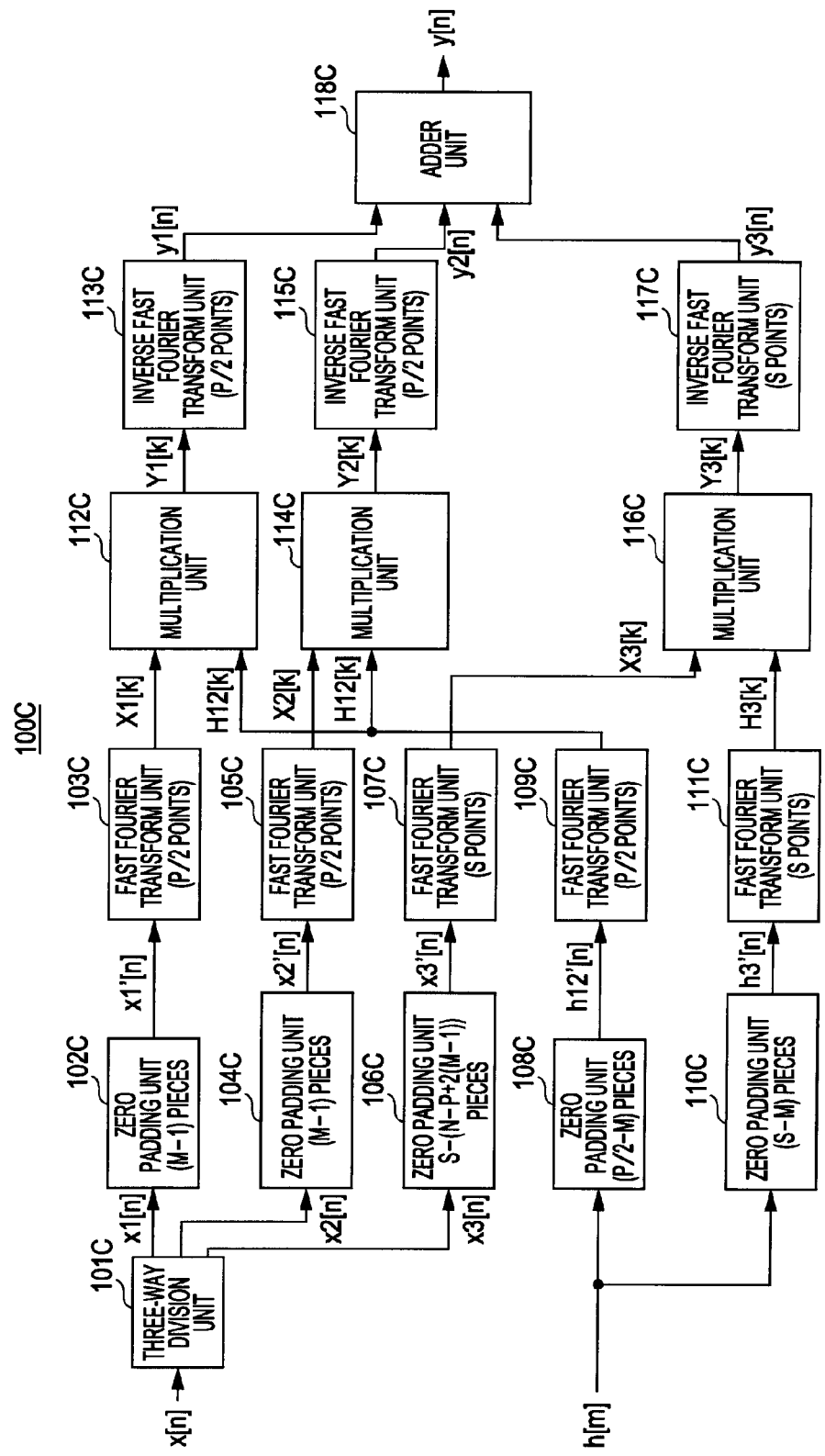

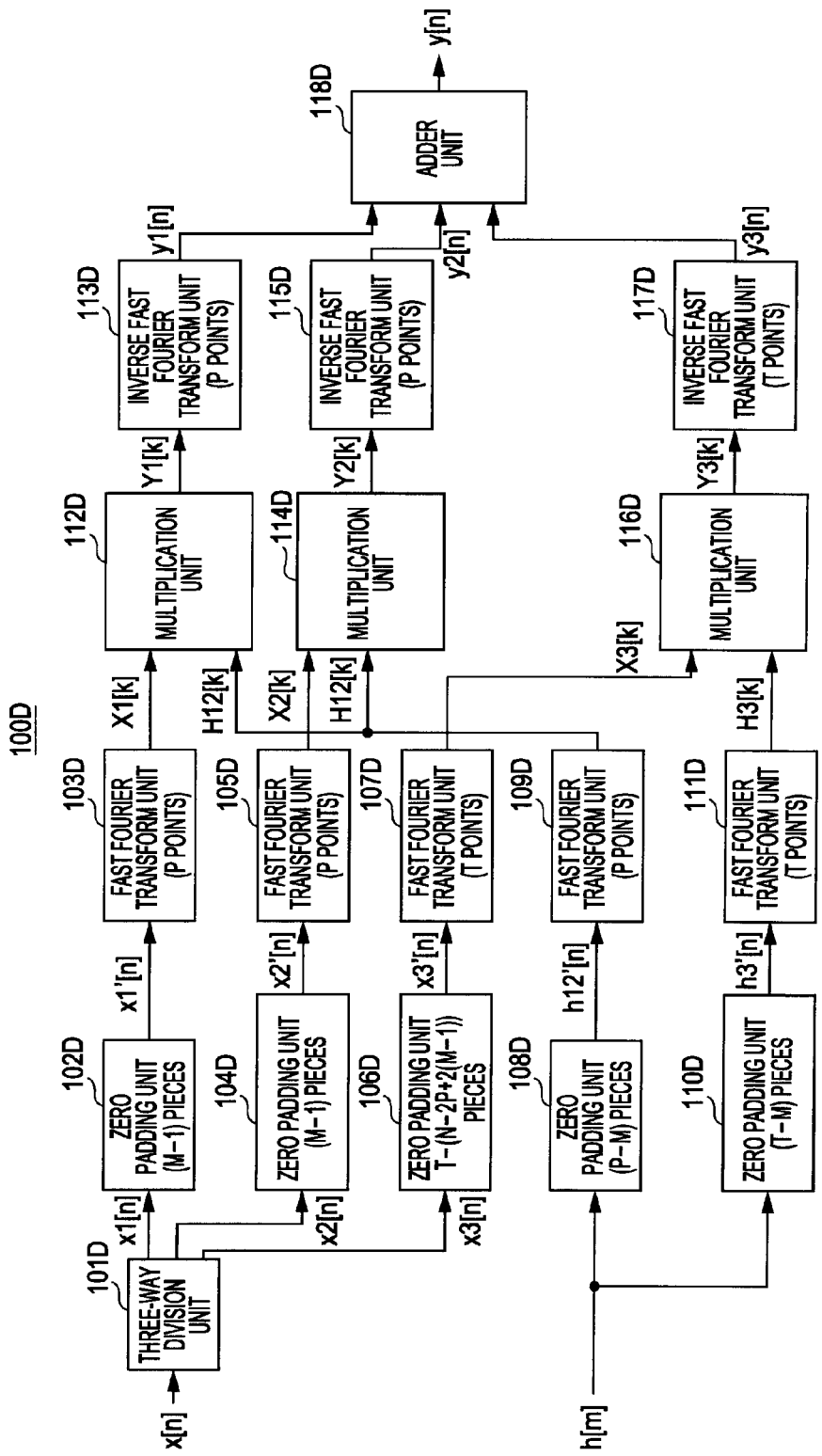

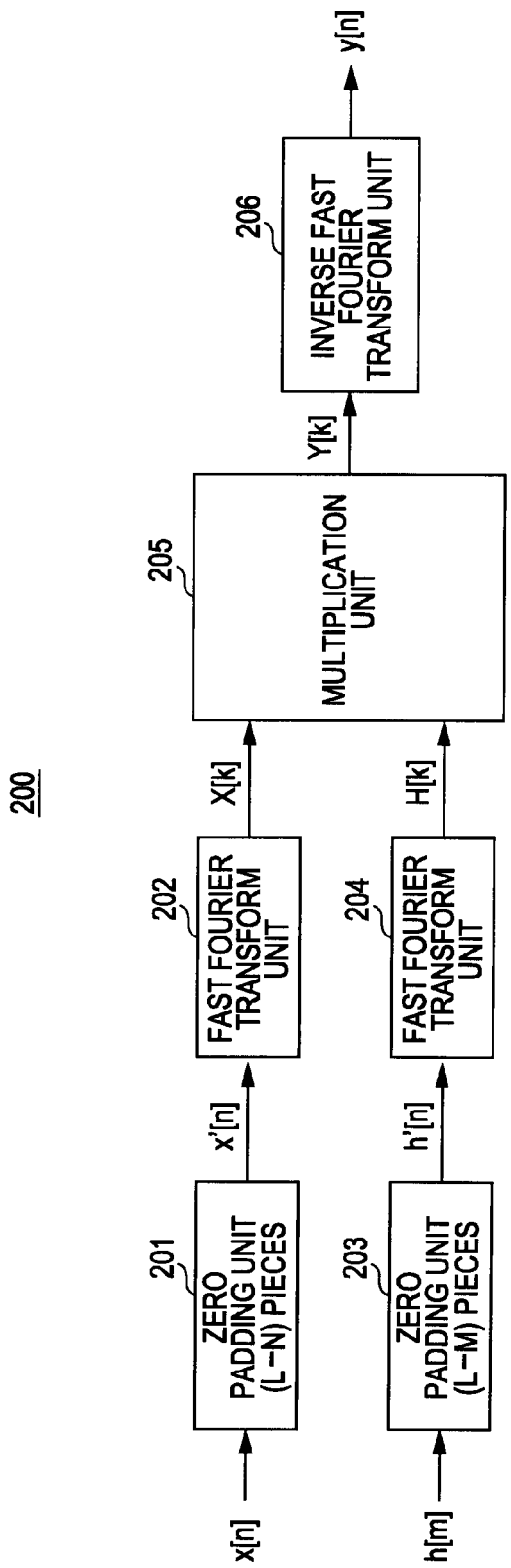

FILTERING APPARATUS, FILTERING METHOD, PROGRAM, AND SURROUND PROCESSOR

BACKGROUND OF THE INVENTION

1. Field of the Invention

The present invention relates to a filtering apparatus, a filtering method, a program, and a surround processor. In particular, the invention relates to a filtering apparatus in which a convolution computation of a discrete-time signal and a filter coefficient is performed through a multiplication in a frequency domain by using fast Fourier transform, and the like.

2. Description of the Related Art

A consideration will be considered on a method of obtaining an output in a case where a discrete-time signal having a length of N (N is an integer) is input to an FIR (Finite impulse Response) filter with a filter coefficient having a length of M (M is an integer). The FIR filter is a filter whose duration time of an impulse response is finite. A discrete-time signal having a length of N is set as x[n] (n=0, 1, 2, ..., N−1), and a filter coefficient having a length of M is set as h[m] (m=0, 1, 2, ..., M−1), and an output is set as y[n] (n=0, 1, 2, ..., N−1). Here, x[n] and h[m] are real numbers, and N≧M−1 is satisfied.

An output y[n] in a case where the discrete-time signal x[n] is input to the FIR filter with the filter coefficient of h[m] can be obtained as shown in an expression (1) through a convolution computation in a time domain. Hereinafter, the convolution computation in the time domain is referred to as the "method A".

$$y[n] = \sum_{m=0}^{M-1} h[m] * x[n-m] \quad (1)$$

In addition to the "method A", a method of attaining the equivalence as the "method A" by obtaining DFTs (Discrete Fourier transform) of x[n] and h[m], multiplying these, and performing IDFT (Inverse Discrete Fourier transform) is also proposed.

The DFTs at N points of x[n] and h[m] are respectively set as X[k] and H[k] where k=0, 1, 2, ..., N−1. A result of obtaining the DFTs at the N points of x[n] and h[m] and performing the multiplication is set as Y'[k]. In this case, Y'[k] is represented by an expression (2).

$$Y'[k]=X[k]*H[k] \quad (2)$$

Where, when the IDFT at the N points of Y'[k] is set as y'[n], on the basis of the cyclic convolution theorem, y'[n] is represented by an expression (3).

$$y'[n] = \sum_{m=0}^{M-1} h[m] * x[n-m]_N \quad (3)$$

Where, x[n−m]N is obtained by cyclically shifting x[n] to the right by m. That is, although x[n] and [m] are multiplied in the frequency domain by using the DFT, an inverse DFT is a convolution computation of a signal obtained by cyclically shifting x[n] to the right by m in the time domain and h[m], and therefore y[n] and y'[n] do not have equivalence.

In view of the above, a method is proposed of attaining equivalence between the result y'[n] obtained by padding (M−1) pieces of zero after x[n], performing the multiplication in the frequency domain, and performing the IDFT and the convolution computation result y[n] in the time domain (for example, see Alan V. Oppenheim, Ronald W. Schafer: "DISCRETE-TIME SIGNAL PROCESSING", PRENTICLE HALL, pp. 548-560). That is, by performing such a zero padding processing, the convolution computation in the time domain can be replaced by the multiplication in the frequency domain.

Here, for reducing calculation costs, FFT (fast Fourier transform) is used instead of DFT. In this case, prior to the FFT processing, data length is set to have a multiplier of 2. The phrase "multiplier of 2," as used throughout the specification and in the claims, is intended to convey the same meaning as "power of 2" as commonly understood in the art to indicate FFT data length. In a case where the FFT is used to realize an equivalent computation to the convolution computation in the time domain through multiplication in the frequency domain, while taking into account a restraint by the cyclic convolution theorem and a restraint for performing the FFT, a computation is performed in such a manner that at least (M−1) pieces of zero are padded after x[n], and the length (transform length) of is set to have a multiplier of 2.

The method of performing such a processing and using the FFT to realize the convolution through multiplication in the frequency domain is referred to as the "method B". As N and M are larger, the "method B" is more superior to the "method A" in terms of computation amount.

FIG. 13 shows a configuration example of a filtering apparatus 200 in which the convolution computation of x[n] and [m] is performed through the "method B" while the transform length is set as L (L is a multiplier of 2). The filtering apparatus 200 includes a zero padding unit 201, a fast Fourier transform unit 202, a zero padding unit 203, a fast Fourier transform unit 204, a multiplication unit 205, and an inverse fast Fourier transform unit 206.

The zero padding unit 201 obtains zero padded data x'[n] (0≦n≦L−1) by padding (L−N) pieces of zero after the discrete-time signal x[n] having the length of N (0≦n≦N−1). The fast Fourier transform unit 202 performs the FFT (fast Fourier transform) on the zero padded data x'[n] obtained by the zero padding unit 201 to obtain frequency domain data X[k] (0≦k≦L−1).

The zero padding unit 203 obtains zero padded data h'[n] (0≦n≦L−1) by padding (L−M) pieces of zero after a filter coefficient h[m] having a length of M (0≦m≦M−1). The fast Fourier transform unit 204 performs the FFT (fast Fourier transform) on the zero padded data h'[n] obtained by the zero padding unit 203 to obtain frequency domain data H[k] (0≦k≦L−1).

The multiplication unit 205 multiplies the frequency domain data X[k] obtained by the fast Fourier transform unit 202 by the frequency domain data H[k] obtained by the fast Fourier transform unit 204 to obtain a multiplication result Y[k] (0≦k≦L−1). Then, the inverse fast Fourier transform unit 206 performs the IFFT (inverse fast Fourier transform) on the multiplication result Y[k] obtained by the multiplication unit 205 to obtain an output discrete-time signal y[n] (0≦n≦L−1).

An operation of the filtering apparatus 200 of FIG. 13 will be described. The filtering target discrete-time signal x[n] having the length of N is supplied to the zero padding unit 201. In the zero padding unit 201, (L−N) pieces of zero are padded after the discrete-time signal x[n] having the length of N, and the zero padded data x'[n] having a length (transform length) of L is obtained. The zero padded data x'[n] is supplied to the fast Fourier transform unit 202. In the fast Fourier transform unit 202, the FFT (fast Fourier transform) is performed on the zero padded data x'[n] to obtain the frequency domain data X[k] ($0 \leq k \leq L-1$).

Also, the filter coefficient h[m] having the length of M is supplied to the zero padding unit 203. In the zero padding unit 203, (L−M) pieces of zero are padded after the filter coefficient h[m] having the length of M, and the zero padded data h'[n] having a length (transform length) of L is obtained. The zero padded data h'[n] is supplied to the fast Fourier transform unit 204. In the fast Fourier transform unit 204, the FFT (fast Fourier transform) is performed on the zero padded data h'[n], and the frequency domain data H[k] is obtained.

The frequency domain data X[k] obtained by the fast Fourier transform unit 202 and the frequency domain data H[k] obtained by the fast Fourier transform unit 204 are supplied to the multiplication unit 205. In the multiplication unit 205, the frequency domain data X[k] is multiplied by the frequency domain data H[k], and the multiplication result Y[k] is obtained. The multiplication result Y[k] is supplied to the inverse fast Fourier transform unit 206. In the inverse fast Fourier transform unit 206, the IFFT (inverse fast Fourier transform) is performed on the multiplication result Y[k], and the output discrete-time signal y[n] is obtained.

SUMMARY OF THE INVENTION

As described above, according to the "method B", in order to perform a computation equivalent to the convolution computation in the time domain, the computation is performed in such a manner that at least (M−1) pieces of zero are padded after the discrete-time signal x[n] having the length of N, and further, in order to perform the FFT, the length (transform length) of is set to have a multiplier of 2.

Here, a minimum multiplier of 2 equal to or larger than N is set as P. FIG. 14A shows a case where a value of (N+M−1) is slightly smaller than P. Also, FIG. 14B shows a case where the value of (N+M−1) is slightly larger than P. In this way, in a case where the value of (N+M−1) is slightly larger than P, as compared with the case where the value of (N+M−1) is slightly smaller than P, the transform length varies by P, and the computation amount and the memory use amount are also increased about two-fold.

It is desirable to reduce the computation amount and the memory use amount in a case where the convolution computation of the discrete-time signal and the filter coefficient is performed by using the fast Fourier transform through the multiplication in the frequency domain.

A concept of an embodiment of the present invention relates to a filtering apparatus configured to obtain an output in a case where a discrete-time signal having a length of N (N is an integer) is input to an FIR filter with a filter coefficient having a length of M (M is an integer, $N \geq M-1$), the filtering apparatus including:

a division unit configured to divide the discrete-time signal having the length of N into a plurality of signals and obtain a plurality of discrete-time signals;

a first zero padding unit configured to pad an appropriate number of zero after the respective discrete-time signals obtained by the division unit and obtain a plurality of pieces of zero padded data having a length of a multiplier of 2;

a first fast Fourier transform unit configured to perform a fast Fourier transform on the respective pieces of zero padded data obtained by the first zero padding unit and obtain a plurality of pieces of frequency domain data;

a second zero padding unit configured to pad zero after the filter coefficient having the length of M and obtain a plurality of pieces of zero padded data having a length corresponding to the respective pieces of zero padded data obtained by the first zero padding unit;

a second fast Fourier transform unit configured to perform a fast Fourier transform on the respective pieces of zero padded data obtained by the second zero padding unit and obtain a plurality of pieces of frequency domain data;

a multiplication unit configured to multiply the respective pieces of frequency domain data obtained by the first fast Fourier transform unit by the respective pieces of frequency domain data obtained by the second fast Fourier transform unit and obtain a plurality of multiplication results;

an inverse fast Fourier transform unit configured to perform inverse fast Fourier transform on the respective multiplication results obtained by the multiplication unit and obtain a plurality of discrete-time signals; and an adder unit configured to add the respective discrete-time signals obtained by the inverse fast Fourier transform unit and obtain an output discrete-time signal.

According to the embodiment of the present invention, the discrete-time signal having the length of N is divided into a plurality of signals, and a plurality of discrete-time signals are obtained. Then, the convolution computation of the respective discrete-time signals and the filter coefficient is performed by using the fast Fourier transform through the multiplication in the frequency domain. Then, the respective convolution computation results are eventually added to obtain an output discrete-time signal.

For example, in the division unit, the discrete-time signal having the length of N is divided into two, and two discrete-time signals are obtained. Then, in the first zero padding unit, when a minimum multiplier of 2 equal to or larger than N (N+M−1) is set as L, the zero padded data having a length of L/2 and the zero padded data having a length equal to or smaller than L/2 are obtained.

Also, for example, when a minimum multiplier of 2 equal to or larger than N is set as P, N and M satisfy $M-1 \leq (P-N)/2$, and in the division unit, the discrete-time signal having the length of N is divided into the discrete-time signal having a length of (P/2−(M−1)) and the discrete-time signal having a length of (N−P/2+(M−1)). Also, for example, when the minimum multiplier of 2 equal to or larger than N is set as P, N and M satisfy $P-N < M-1 \leq P-N/2$, and in the division unit, the discrete-time signal having the length of N is divided into the discrete-time signal having a length of (P−(M−1)) and the discrete-time signal having a length of (N−P+(M−1)).

When the output is obtained in a case where the discrete-time signal having the length of N (N is an integer) is input to the FIR filter with the filter coefficient having the length of M (M is an integer, $N \geq M-1$), as described above, the discrete-time signal having the length of N is divided into the plurality of discrete-time signals to be processed. Thus, as compared with the related art method, it is possible to reduce the computation amount and the memory use amount.

According to the embodiment of the present invention, when the output is obtained in a case where the discrete-time signal having the length of N (N is an integer) is input to the FIR filter with the filter coefficient having the length of M (M is an integer, $N \geq M-1$), as compared with the related art method, it is possible to reduce the computation amount and the memory use amount.

BRIEF DESCRIPTION OF THE DRAWINGS

FIG. 1 is a block diagram of a configuration example of a surround processor according to an embodiment of the present invention;

FIG. 2 is a block diagram of a configuration example of a filtering unit constituting the surround processor (in a case where two-way division is performed on the basis of N+M−1≦P);

FIGS. 3A to 3C are explanatory diagrams for describing a state in which a discrete-time signal having a length of N is divided into two discrete-time signals and a filtering processing is performed;

FIG. 4 is a block diagram of another configuration example of a filtering unit constituting the surround processor (in a case where two-way division is performed on the basis of N+M−1>P);

FIGS. 5A to 5C are explanatory diagrams for describing a state in which the discrete-time signal x[n] having the length of N is divided into two discrete-time signals and a filtering processing is performed;

FIG. 8 is a block diagram of a configuration example of another filtering unit constituting the surround processor (in a case where three-way division is performed on the basis of N+M−1≦P);

FIG. 10 is a block diagram of a configuration example of another filtering unit constituting the surround processor (in a case where three-way division is performed on the basis of N+M−1>P);

FIG. 13 is a block diagram of a configuration example of a filtering apparatus in related art.

DESCRIPTION OF THE PREFERRED EMBODIMENTS

Figure 6:
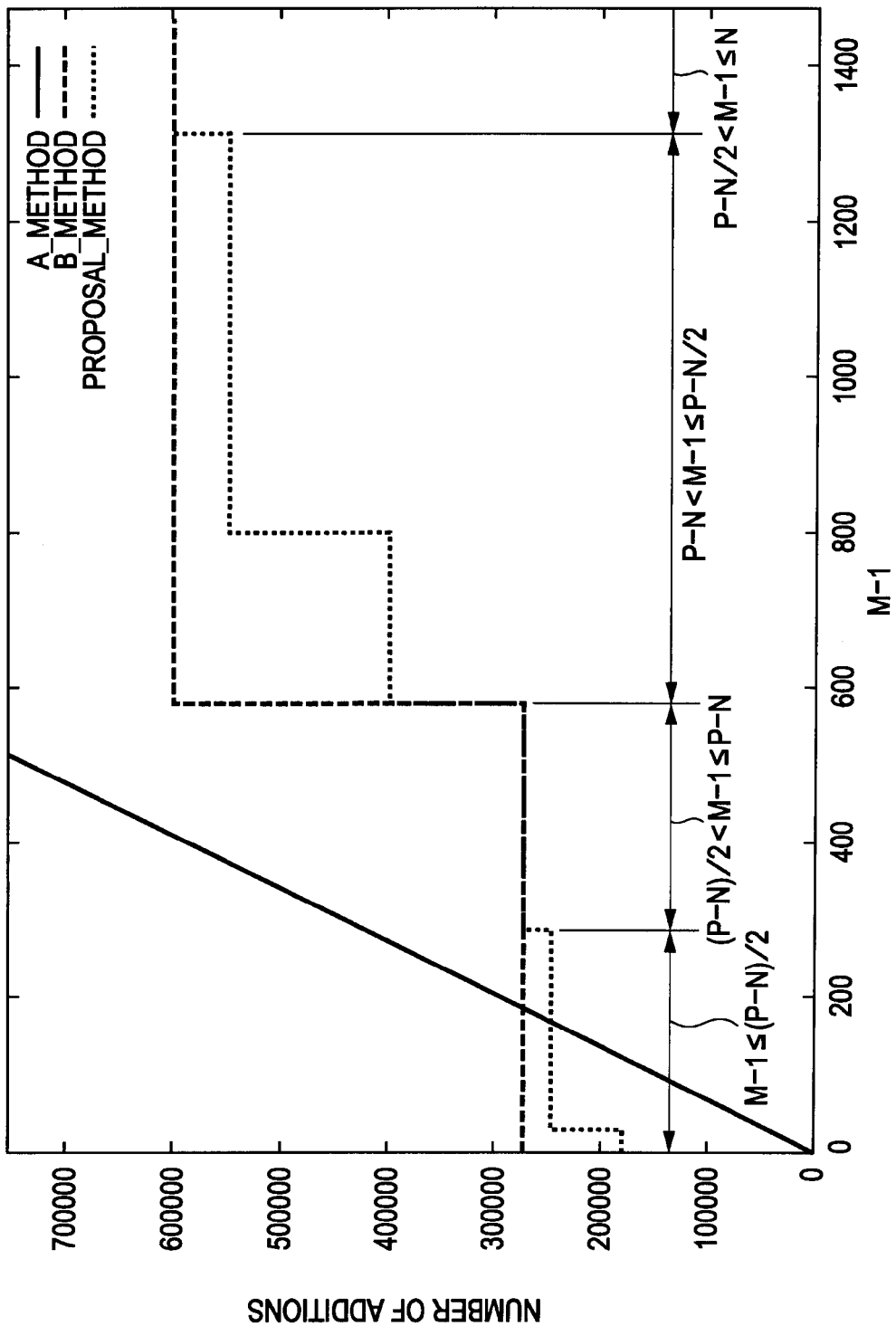
FIG. 6 is a graphic representation illustrating a comparison on the number of additions among a "method A" (A_Method), a "method B" (B_Method), and a "proposal method" (Proposal_Method) in a case where M−1 is changed from 1 to N when N=1472.

Hereinafter, embodiments for carrying out the invention (hereinafter, which will be referred to as "embodiments") will be described.

It should be noted that the description will be given in the following order.
1. Embodiments
2. Modified Examples.

1. Embodiments

Configuration Example of Surround Processor

FIG. 1 shows a configuration example of a surround processor 10 according to an embodiment of the present invention. The surround processor 10 down-mixes 5.1-channel multichannel audio into 2-channel stereo audio.

The surround processor 10 includes filtering units 11-1 to 11-6 configured to obtain left audio signal components, filtering units 12-1 to 12-6 configured to obtain right audio signal components, an adder unit 13, and an adder unit 14.

A 5.1-channel multichannel audio signal is composed of a left front signal Sig_L, a right front signal Sig_R, a front signal Sig_C, a bass output signal Sig_LFE, a left rear signal Sig_RL, and a right rear signal Sig_RR. Also, a 2-channel stereo audio signal is composed of a left audio signal Sig_L' and a right audio signal Sig_R'.

The filtering unit 11-1 (Filter_L_L) extracts a left audio signal component from the left front signal Sig_L. The filtering unit 11-2 (Filter_L_R) extracts the left audio signal component from the right front signal Sig_R. The filtering unit 11-3 (Filter_L_C) extracts the left audio signal component from the front signal Sig_C.

The filtering unit 11-4 (Filter_L_LFE) extracts the left audio signal component from the bass output signal Sig_LFE. The filtering unit 11-5 (Filter_L_RL) extracts the left audio signal component from the left rear signal Sig_RL. The filtering unit 11-6 (Filter_L_RR) extracts the left audio signal component from the right rear signal Sig_RR. Then, the adder unit 13 adds the respective left audio signal component extracted by the filtering units 11-1 to 11-6 to obtain a left audio signal S_L'.

Also, the filtering unit 12-1 (Filter_R_L) extracts a right audio signal component from the left front signal Sig_L. The filtering unit 12-2 (Filter_R_R) extracts the right audio signal component from the right front signal Sig_R. The filtering unit 12-3 (Filter_R_C) extracts the right audio signal component from the front signal Sig_C.

The filtering unit 12-4 (Filter_R_LFE) extracts the right audio signal component from the bass output signal Sig_LFE. The filtering unit 12-5 (Filter_R_RL) extracts the right audio signal component from the left rear signal Sig_RL. The filtering unit 12-6 (Filter_R_RR) extracts the right audio signal component from the right rear signal Sig_RR. Then, the adder unit 14 adds the respective right audio signal component extracted by the filtering units 12-1 to 12-6 to obtain a right audio signal S_R'.

[Configuration Example of Filtering Unit]

FIGS. 2 and 4 show configuration examples of filtering units 100A and 100B used as the above-mentioned filtering units 11-1 to 11-6 and 12-1 to 12-6. The filtering units 100A and 100B obtains an output in a case where a discrete-time signal x[n] having a length of N (N is an integer) (discrete-time audio signal) ($0 \leq n \leq N-1$) is input to a FIR filter with a filter coefficient h[m] ($0 \leq m \leq M-1$) having a length of M (M is an integer). The filtering units 100A and 100B perform a convolution computation of the discrete-time signal x[n] and the filter coefficient h[m] by using a fast Fourier transform through a multiplication in the frequency domain. Here, x[n] and h[m] are real numbers, and $N \geq M-1$ is satisfied.

In the filtering unit 100A of FIG. 2, when a minimum multiplier of 2 equal to or larger than N is set as P, N and M are configured so as to satisfy $M-1 \leq (P-N)/2$. In the filtering unit 100A, the discrete-time signal x[n] having the length of N is divided into a discrete-time signal x1[n] having a length of (P/2−(M−1)) and a discrete-time signal x2[n] having a length of (N−P/2+(M−1)) to be processed. In the filtering unit 100A of FIG. 2, as described above, the discrete-time signal x[n] having the length of N is divided into the two discrete-time signals x1[n] and x2[n] to be processed, and thus, as compared with the "B method" in related art, it is possible to reduce the computation amount and the memory use amount. This reason will be described below.

Also, in the filtering unit 100B of FIG. 4, when the minimum multiplier of 2 equal to or larger than N is set as P, N and M are configured so as to satisfy P−N<M−1≦P−N/2. In the filtering unit 100B, the discrete-time signal x[n] having the length of N is divided into a discrete-time signal x1[n] having a length of (P−(M−1)) and a discrete-time signal x2[n] having a length of (N−P+(M−1)) to be processed. In the filtering unit 100B of FIG. 4, as described above, the discrete-time signal x[n] having the length of N is divided into the two discrete-time signals x1[n] and x2[n] to be processed, and thus, as compared with the "B method" in related art, it is possible to reduce the computation amount and the memory use amount. This reason will be described below.

First, the filtering unit 100A of FIG. 2 will be described. The filtering unit 100A of FIG. 2 is applied when the minimum multiplier of 2 equal to or larger than N is set as P, as shown in FIG. 3A, in a case where N+M−1≦P is satisfied. In this case, as the minimum multiplier of 2 equal to or larger than N+M−1 is P, a transform length when the processing is performed according to the "method B" is P.

The filtering unit 100A includes a two-way division unit 101A, a zero padding unit 102A, a fast Fourier transform unit 103A, a zero padding unit 104A, and a fast Fourier transform unit 105A. Also, the filtering unit 100A has a zero padding unit 106A, a fast Fourier transform unit 107A, a zero padding unit 108A, and a fast Fourier transform unit 109A. Furthermore, the filtering unit 100A has a multiplication unit 110A, an inverse fast Fourier transform unit 111A, a multiplication unit 112A, an inverse fast Fourier transform unit 113A, and an adder unit 114A.

The two-way division unit 101A divides the discrete-time signal x[n] having the length of N (0≦n≦N−1) into two and obtains two discrete-time signals x1[n] (0≦n≦N1−1) and x2[n] (0≦n≦N2−1). Here, a length of N1 of the discrete-time signal x1[n] is set as P/2−(M−1) as shown in FIG. 3B. Also, a length of N2 of the discrete-time signal x2[n] is set as N−P/2+(M−1) as shown in FIG. 3A.

The zero padding unit 102A pads (P/2−N1) pieces, that is, (M−1) pieces of zero after the discrete-time signal x1[n] having the length of N1 to obtain zero padded data x1'[n] having a length of P/2 (0≦n≦P/2−1). The fast Fourier transform unit 103A performs the FFT (fast Fourier transform) on the zero padded data x1'[n] obtained by the zero padding unit 102A to obtain frequency domain data X1[k] (0≦k≦P/2−1).

The zero padding unit 104A pads (Q−N2) pieces, that is, (Q−(N−P/2+(M−1)) pieces of zero after the discrete-time signal x2[n] having the length of N2 to obtain zero padded data x2'[n] having a length Q (0≦n≦Q−1). Here, Q is a minimum multiplier of 2 equal to or larger than N2+M−1. The fast Fourier transform unit 105A performs the FFT (fast Fourier transform) on the zero padded data x2'[n] obtained by the zero padding unit 104A to obtain frequency domain data X2[k] (0≦k≦Q−1).

The zero padding unit 106A pads (P/2−M) pieces of zero after the filter coefficient h[m] having the length of M (0≦m≦M−1) to obtain zero padded data h1'[n] (0≦n≦P/2−1) having a length corresponding to the above-mentioned zero padded data x1'[n] (0≦n≦P/2−1). The fast Fourier transform unit 107A performs the FFT (fast Fourier transform) on the zero padded data h1'[n] obtained by the zero padding unit 106A to obtain frequency domain data H1[k] (0≦k≦P/2−1).

The zero padding unit 108A pads (Q−M) pieces of zero after the filter coefficient h[m] having the length of M (0≦m≦M−1) to obtain zero padded data h2'[n] (0≦n≦Q−1) having a length corresponding to the above-mentioned zero padded data x2'[n] (0≦n≦Q−1). The fast Fourier transform unit 109A performs the FFT (fast Fourier transform) on the zero padded data h2'[n] obtained by the zero padding unit 108A to obtain frequency domain data H2[k] (0≦k≦Q−1).

The multiplication unit 110A multiplies the frequency domain data X1[k] obtained by the fast Fourier transform unit 103A and the frequency domain data H1[k] obtained by the fast Fourier transform unit 107A to obtain a multiplication result Y1[k] (0≦k≦P/2−1). Then, the inverse fast Fourier transform unit 111A performs the IFFT (inverse fast Fourier transform) on the multiplication result Y1[k] obtained by the multiplication unit 110A to obtain a discrete-time signal y1[n] (0≦n≦P/2−1).

The multiplication unit 112A multiplies the frequency domain data X2[k] obtained by the fast Fourier transform unit 105A by the frequency domain data H2[k] obtained by the fast Fourier transform unit 109A to obtain a multiplication result Y2[k] (0≦k≦Q−1). Then, the inverse fast Fourier transform unit 113A performs the IFFT (inverse fast Fourier transform) on the multiplication result Y2[k] obtained by the multiplication unit 112A to obtain a discrete-time signal y2[n] (0≦n≦Q−1).

The adder unit 114A adds the discrete-time signal y1[n] obtained by the inverse fast Fourier transform unit 111A with the discrete-time signal y2[n] obtained by the inverse fast Fourier transform unit 113A to obtain a output discrete-time signal y[n]. The output discrete-time signal y[n] becomes a convolution computation result of the discrete-time signal x[n] and the filter coefficient h[m]. It should be noted that the adder unit 114A obtains the output discrete-time signal y[n] through an overlap-add method (see the above-mentioned document "DISCRETE-TIME SIGNAL PROCESSING") for ensuring the consistency with the case where the convolution computation of the discrete-time signal x[n] and the filter coefficient h[m] is performed without the division.

An operation of the filtering unit 100A of FIG. 2 will be described. The filtering target discrete-time signal having the length of N (discrete-time audio signal) x[n] is supplied to the two-way division unit 101A. In the two-way division unit 101A, the discrete-time signal x[n] having the length of N (0≦n≦N−1) is divided into two. Then, from the two-way division unit 101A, the discrete-time signal x1[n] having the length of N1=P/2−(M−1) (0≦n≦N1−1) is obtained. Also, from the two-way division unit 101A, the discrete-time signal x2[n] having the length of N2=N−P/2+(M−1) (0≦n≦N2−1) is obtained.

The discrete-time signal x1[n] obtained by the two-way division unit 101A is supplied to the zero padding unit 102A. In the zero padding unit 102A, after the discrete-time signal x1[n] having the length of N1, (M−1) pieces of zero are padded, and the zero padded data x1'[n] having the length (transform length) of P/2 is obtained. The zero padded data x1'[n] is supplied to the fast Fourier transform unit 103A. In the fast Fourier transform unit 103A, the FFT (fast Fourier transform) is performed on the zero padded data x1'[n], and the frequency domain data X1[k] (0≦k≦P/2−1) is obtained.

Also, the discrete-time signal x2[n] obtained by the two-way division unit 101A is supplied to the zero padding unit 104A. In the zero padding unit 104A, after the discrete-time signal x2[n] having the length of N2, Q−(N−P/2+(M−1)) pieces of zero are padded, and the zero padded data x2'[n]

having the length (transform length) of Q is obtained. The zero padded data x2'[n] is supplied to the fast Fourier transform unit 105A. In the fast Fourier transform unit 105A, the FFT (fast Fourier transform) is performed on the zero padded data x2'[n], and the frequency domain data X2[k] ($0 \leq k \leq Q-1$) is obtained.

Also, the filter coefficient h[m] having the length of M is supplied to the zero padding unit 106A. In the zero padding unit 106A, after the filter coefficient h[m] having the length of M, (P/2−M) pieces of zero are padded, and the zero padded data h1'[n] having the length (transform length) of P/2 is obtained. The zero padded data h1'[n] is supplied to the fast Fourier transform unit 107A. In the fast Fourier transform unit 107A, the FFT (fast Fourier transform) is performed on the zero padded data h1'[n], and the frequency domain data H1[k] is obtained.

Also, the filter coefficient h[m] having the length of M is supplied to the zero padding unit 108A. In the zero padding unit 108A, after the filter coefficient h[m] having the length of M, (Q−M) pieces of zero are padded, and the zero padded data h2'[n] having the length (transform length) of Q is obtained. The zero padded data h2'[n] is supplied to the fast Fourier transform unit 109A. In the fast Fourier transform unit 109A, the FFT (fast Fourier transform) is performed on the zero padded data h2'[n], and the frequency domain data H2[k] is obtained.

The frequency domain data X1[k] obtained by the fast Fourier transform unit 103A and the frequency domain data H1[k] obtained by the fast Fourier transform unit 107A are supplied to the multiplication unit 110A. In the multiplication unit 110A, the frequency domain data X1[k] is multiplied by the frequency domain data H1[k], and the multiplication result Y1[k] is obtained. The multiplication result Y1[k] is supplied to the inverse fast Fourier transform unit 111A. In the inverse fast Fourier transform unit 111A, the IFFT (inverse fast Fourier transform) is performed on the multiplication result Y1[k], and the discrete-time signal y1[n] is obtained.

Also, the frequency domain data X2[k] obtained by the fast Fourier transform unit 105A and the frequency domain data H2[k] obtained by the fast Fourier transform unit 109A are supplied to the multiplication unit 112A. In the multiplication unit 112A, the frequency domain data X2[k] is multiplied by the frequency domain data H2[k], and the multiplication result Y2[k] is obtained. The multiplication result Y2[k] is supplied to the inverse fast Fourier transform unit 113A. In the inverse fast Fourier transform unit 113A, the IFFT (inverse fast Fourier transform) is performed on the multiplication result Y2[k], and the discrete-time signal y2[n] is obtained.

The discrete-time signal y1[n] obtained by the inverse fast Fourier transform unit 111A and the discrete-time signal y2[n] obtained by the inverse fast Fourier transform unit 113A are supplied to the adder unit 114A. In the adder unit 114A, through the overlap-add method, the discrete-time signals y1[n] and y2[n] are added, and the output discrete-time signal y[n] is obtained.

Next, the filtering unit 100B of FIG. 4 will be described. The filtering unit 100B of FIG. 4 is applied when the minimum multiplier of 2 equal to or larger than N is set as P, as shown in FIG. 5A, in a case where N+M−1>P is satisfied. In this case, as the minimum multiplier of 2 equal to or larger than N+M−1 is 2P, the transform length when the processing is performed according to the "method B" is 2P.

The filtering unit 100B includes a two-way division unit 101B, a zero padding unit 102B, a fast Fourier transform 103B, a zero padding unit 104B, and a fast Fourier transform 105B. Also, the filtering unit 100B includes a zero padding unit 106B, a fast Fourier transform 107B, a zero padding unit 108B, and a fast Fourier transform 109B. Furthermore, the filtering unit 100B includes a multiplication unit 110B, an inverse fast Fourier transform 111B, a multiplication unit 112B, an inverse fast Fourier transform 113B, and an adder unit 114B.

The two-way division unit 101B divides the discrete-time signal x[n] having the length of N ($0 \leq n \leq N-1$) into two and obtains two discrete-time signals x1[n] ($0 \leq n \leq N1-1$) and x2[n] ($0 \leq n \leq N2-1$). Here, the length of N1 of the discrete-time signal x1[n] is set as P−(M−1) as shown in FIG. 5B. Also, the length of N2 of the discrete-time signal x2[n] is set as N−P+(M−1) as shown in FIG. 5C.

The zero padding unit 102B pads (P−N1) pieces, that is, (M−1) pieces of zero after the discrete-time signal x1[n] having the length of N1 to obtain zero padded data x1'[n] having the length of P ($0 \leq n \leq P-1$). The fast Fourier transform 103B performs the FFT (fast Fourier transform) on the zero padded data x1'[n] obtained by the zero padding unit 102B to obtain frequency domain data X1[k] ($0 \leq k \leq P-1$).

The zero padding unit 104B pads (R−N2) pieces, that is, (R−(N−P+(M−1))) pieces of zero after the discrete-time signal x2[n] having the length of N2 to obtain zero padded data x2'[n] ($0 \leq n \leq R-1$) having a length of R. Here, R is a minimum multiplier of 2 equal to or larger than N2+M−1. The fast Fourier transform 105B performs the FFT (fast Fourier transform) on the zero padded data x2'[n] obtained by the zero padding unit 104B to obtain frequency domain data X2[k] ($0 \leq k \leq R-1$).

The zero padding unit 106B pads (P−M) pieces of zero after the filter coefficient h[m] having the length of M ($0 \leq m \leq M-1$) to obtain zero padded data h1'[n] ($0 \leq n \leq P-1$) having a length corresponding to the above-mentioned zero padded data x1'[n] ($0 \leq n \leq P-1$). The fast Fourier transform 107B performs the FFT (fast Fourier transform) on the zero padded data h1'[n] obtained by the zero padding unit 106B to obtain frequency domain data H1[k] ($0 \leq k \leq P-1$).

The zero padding unit 108B pads (R−M) pieces of zero after the filter coefficient h[m] having the length of M ($0 \leq m \leq M-1$) to obtain zero padded data h2'[n] ($0 \leq n \leq R-1$) having a length corresponding to the above-mentioned zero padded data x2'[n] ($0 \leq n \leq R-1$). The fast Fourier transform 109B performs the FFT (fast Fourier transform) on the zero padded data h2'[n] obtained by the zero padding unit 108B to obtain frequency domain data H2[k] ($0 \leq k \leq R-1$).

The multiplication unit 110B multiplies the frequency domain data X1[k] obtained by the fast Fourier transform 103B by the frequency domain data H1[k] obtained by the fast Fourier transform 107B to obtain a multiplication result Y1[k] ($0 \leq k \leq P-1$). Then, the inverse fast Fourier transform 111B performs the IFFT (inverse fast Fourier transform) on the multiplication result Y1[k] obtained by the multiplication unit 110B to obtain a discrete-time signal y1[n] ($0 \leq n \leq P-1$).

The multiplication unit 112B multiplies the frequency domain data X2[k] obtained by the fast Fourier transform 105B by the frequency domain data H2[k] obtained by the fast Fourier transform 109B to obtain a multiplication result Y2[k] ($0 \leq k \leq R-1$). Then, the inverse fast Fourier transform 113B performs the IFFT (inverse fast Fourier transform) on the multiplication result Y2[k] obtained by the multiplication unit 112B to obtain a discrete-time signal y2[n] ($0 \leq n \leq R-1$).

The adder unit 114B adds the discrete-time signal y1[n] obtained by the inverse fast Fourier transform 111B with the discrete-time signal y2[n] obtained by the inverse fast Fourier transform 113B to obtain an output discrete-time signal y[n]. The output discrete-time signal y[n] becomes a convolution computation result of the discrete-time signal x[n] and the filter coefficient h[m]. It should be noted that the adder unit 114B obtains the output discrete-time signal y[n] through the overlap-add method (see the above-mentioned document "DISCRETE-TIME SIGNAL PROCESSING") for ensuring the consistency with the case where the convolution computation of the discrete-time signal x[n] and the filter coefficient h[m] is performed without the division.

An operation of the filtering unit 100A in FIG. 4 will be described. A filtering target discrete-time signal having a length of N (discrete-time audio signal) x[n] is supplied to the two-way division unit 101B. In the two-way division unit 101B, the discrete-time signal x[n] having the length of N ($0 \leq n \leq N-1$) is divided into two. Then, from the two-way division unit 101B, the discrete-time signal x1[n] ($0 \leq n \leq N1-1$) having the length of N1=P−(M−1) is obtained. Also, from the two-way division unit 101B, the discrete-time signal x2[n] ($0 \leq n \leq N2-1$) having the length of N2=N−P+(M−1) is obtained.

The discrete-time signal x1[n] obtained by the two-way division unit 101B is supplied to the zero padding unit 102B. In the zero padding unit 102B, after the discrete-time signal x1[n] having the length of N1, (M−1) pieces of zero are padded, and the zero padded data x1'[n] having the length (transform length) of P is obtained. The zero padded data x1'[n] is supplied to the fast Fourier transform 103B. In the fast Fourier transform 103B, the FFT (fast Fourier transform) is performed on the zero padded data x1'[n], and the frequency domain data X1[k] ($0 \leq k \leq P-1$) is obtained.

Also, the discrete-time signal x2[n] obtained by the two-way division unit 101B is supplied to the zero padding unit 104B. In the zero padding unit 104B, after the discrete-time signal x2[n] having the length of N2, R−(N−P+(M−1)) pieces of zero are padded, and the zero padded data x2'[n] having the length (transform length) of R is obtained. The zero padded data x2'[n] is supplied to the fast Fourier transform 105B. In the fast Fourier transform 105B, the FFT (fast Fourier transform) is performed on the zero padded data x2'[n], and the frequency domain data X2[k] ($0 \leq k \leq R-1$) is obtained.

Also, the filter coefficient h[m] having the length of M is supplied to the zero padding unit 106B. In the zero padding unit 106B, after the filter coefficient h[m] having the length of M, (P−M) pieces of zero are padded, and the zero padded data h1'[n] having the length (transform length) of P is obtained. The zero padded data h1'[n] is supplied to the fast Fourier transform 107B. In the fast Fourier transform 107B, the FFT (fast Fourier transform) is performed on the zero padded data h1'[n], and the frequency domain data H1[k] is obtained.

Also, the filter coefficient h[m] having the length of M is supplied to the zero padding unit 108B. In the zero padding unit 108B, after the filter coefficient h[m] having the length of M, (R−M) pieces of zero are padded, and the zero padded data h2'[n] having the length (transform length) of R is obtained. The zero padded data h2'[n] is supplied to the fast Fourier transform 109B. In the fast Fourier transform 109B, the FFT (fast Fourier transform) is performed on the zero padded data h2'[n], and the frequency domain data H2[k] is obtained.

The frequency domain data X1[k] obtained by the fast Fourier transform 103B and the frequency domain data H1[k] obtained by the fast Fourier transform 107B are supplied to the multiplication unit 110B. In the multiplication unit 110B, the frequency domain data X1[k] is multiplied by the frequency domain data H1[k], and the multiplication result Y1[k] is obtained. The multiplication result Y1[k] is supplied to the inverse fast Fourier transform 111B. In the inverse fast Fourier transform 111B, the IFFT (inverse fast Fourier transform) is performed on the multiplication result Y1[k], and the discrete-time signal y1[n] is obtained.

Also, the frequency domain data X2[k] obtained by the fast Fourier transform 105B and the frequency domain data H2[k] obtained by the fast Fourier transform 109B are supplied to the multiplication unit 112B. In the multiplication unit 112B, the frequency domain data X2[k] is multiplied by the frequency domain data H2[k], and the multiplication result Y2[k] is obtained. The multiplication result Y2[k] is supplied to the inverse fast Fourier transform 113B. In the inverse fast Fourier transform 113B, the IFFT (inverse fast Fourier transform) is performed on the multiplication result Y2[k], and the discrete-time signal y2[n] is obtained.

The discrete-time signal y1[n] obtained by the inverse fast Fourier transform 111B and the discrete-time signal y2[n] obtained by the inverse fast Fourier transform 113B are supplied to the adder unit 114B. In the adder unit 114B, through the overlap-add method, the discrete-time signals y1[n] and y2[n] are added, and the output discrete-time signal y[n] is obtained.

[Reason for Reduction in Computation Amount and Memory Use Amount]

In the filtering units 100A and 100B of FIGS. 2 and 4, a reason for reduction in the computation amount and the memory use amount will be described.

The filtering unit 100A of FIG. 2 is applied in a case where $N+M-1 \leq P$ is satisfied as shown in FIG. 3A. Then, as shown in FIGS. 3B and 3C, the discrete-time signal x[n] having the length of N is divided into two signals including the discrete-time signal x1[n] having the length of N1=P/2−(M−1) and the discrete-time signal x2[n] having the length of N2=N−P/2+(M−1) to be processed. Here, in the case of N1≧N2, that is, when $M-1 \leq (P-N)/2$ is established, the transform length (multiplier of 2) of x2[n] is equal to or smaller than the transform length of P/2 of x1[n].

In the filtering unit 100A of FIG. 2, as described above, N and M are configured so as to satisfy M−1≦P−N. Therefore, the transform length (multiplier of 2) of x2[n] is equal to or smaller than the transform length of P/2 of x1[n]. As compared with a case where the processing is performed according to the "method B" in which the discrete-time signal x[n] having the length of N is not divided and the transform length is P, it is possible to reduce the computation amount and the memory use amount.

It should be noted that in a case where N and M do not satisfy M−1≦(P−N)/2 but N and M satisfy (P−N)/2<M−1≦P−N, the transform length Q of x2[n] is not set to be equal to or smaller than the transform length of P/2 of x1[n], and Q=P is established. In this case, as compared with a case where the processing is performed according to the "method B", this is interior in terms of the computation amount and the memory use amount.

Also, the filtering unit 100B of FIG. 4 is applied in a case where N+M−1>P is satisfied as shown in FIG. 5A. Then, as shown in FIGS. 5B and 5C, the discrete-time signal x[n] having the length of N is divided into two signals including the discrete-time signal x1[n] having the length of N1=P−(M−1) and the discrete-time signal x2[n] having the length of N2=N−P+(M−1) to be processed. Here, in the case of N1≧N2, that is, when P−N<M−1≦P−N/2 is established, the transform length R (multiplier of 2) of x2[n] is equal to or smaller than the transform length of P of x1[n].

In the filtering unit 100B of FIG. 4, as described above, N and M are configured so as to satisfy P−N<M−1≦P−N/2. Therefore, the transform length R of x2[n] (multiplier of 2) is equal to or smaller than the transform length of P of x1[n]. As compared with a case where the processing is performed according to the "method B" in which the discrete-time signal x[n] having the length of N is not divided, it is possible to reduce the computation amount and the memory use amount.

It should be noted that in a case where N and M do not satisfy P−N<M−1≦P−N/2 but N and M satisfy P−N/2<M−1≦N, the transform length R of x2[n] is not set to be equal to or smaller than the transform length of P of x1[n], and R=2P is established. In this case, as compared with a case where the processing is performed according to the "method B", this is inferior in terms of the computation amount and the memory use amount.

[Comparison on Computation Amount and Memory Use Amount]

Here, the computation amount and the memory use amount are compared among the "method A", the "method B", and a method of dividing x[n] as shown in FIGS. 2 and 4 (hereinafter, which will be referred to as "proposal method").

"Comparison on Computation Amount"

<Conditions for Comparison>

In this comparison, the numbers of additions and multiplications are simply compared.

As to the "method A" of the convolution computation in the time domain, the numbers of additions and multiplications are evaluated only regarding a product-sum operation part in a loop.

As to the computation amount of the FFT, a cosine value and a sine value of a complex exponential function (see expression (4)) of a butterfly computation unit are held as data, and the numbers of additions and multiplications are evaluated only regarding the additions of the butterfly computation unit and the multiplications of the addition result and the complex exponential function.

$$W_N^K = eqp\left(\frac{-j2\pi k}{N}\right) = \cos\left(\frac{2\pi k}{N}\right) - j\sin\left(\frac{j\pi k}{N}\right) \quad (4)$$

It should be noted that P, Q, and R can be calculated by the following expressions.

$P=2**\text{int}(\log 2(N*2-1))$ $Q=2**\text{int}(\log 2((N+2*M-2-P/2)*2-1)$ $R=2**\text{int}(\log 2((N+2*M-2-P)*2-1)$ It should be however that int(x) denotes an integer x whose fractional part is cut off, and log 2(x) denotes a logarithm to the base 2.

<Calculation Results of Computation Amount>

Calculation results on the computation amount according to the "method A", the "method B", and the "proposal method" are shown below.

"Method A"

In the entire range of M−1≦N, the following expressions (5) and (6) represent the results.

Additions: $N*M$ (5)

Multiplications: $N*M$ (6)

"Method B"

In the case of M−1≦P−N, the following expressions (7) and (8) represent the results.

Additions: $12*P*\log 2(P)+2*P$ (7)

Multiplications: $6*P*\log 2(P)+4*P$ (8)

In the case of P−N<M−1≦N, the following expressions (9) and (10) represent the results.

Additions: $24*P*\log 2(P)+28*P$ (9)

Multiplications: $12*P*\log 2(P)+20*P$ (10)

"Proposal Method"

A. In a case where M−1≦(P−N)/2 is satisfied, and x[n] is divided into two (the case of the filtering unit 100A of FIG. 2), the following expressions (11) and (12) represent the results.

Additions: $6*P*\log 2(P)-5*P+12*Q*\log 2(Q)+2*Q+M-1$ (11)

Multiplications: $3*P*\log 2(P)-P+6*Q*\log 2(Q)+4*Q$ (12)

B. In a case where P−N<M−1≦P−N/2 is satisfied, and x[n] is divided into two (the case of the filtering unit 100B of FIG. 4), the following expressions (13) and (14) represent the results.

Additions: $12*P*\log 2(P)+2*P+12*R*\log 2(R)+2*R+M-1$ (13)

Multiplications: $6*P*\log 2(P)+4*P+6*R*\log 2(R)+4*R$ (14)

<Difference of Computation Amount Between Method B and Proposal Method>

A. In the case of M−1≦(P−N)/2 (the case of the filtering unit 100A of FIG. 2), the minimum values respectively obtained by subtracting the computation amount according to the proposal method from the computation amount according to the method B are represented by the following expressions (15) and (16) while Q=P/2 is set.

Additions: $12*P-M+1$ (15)

Multiplications: $6*P$ (16)

Therefore, in this case, the difference is positive both in the additions and the multiplications, and it is understood that the proposal method is superior to the method B in terms of the computation amount.

B. In the case of P−N<M−1≦P−N/2 (the case of the filtering unit 100B of FIG. 4), the minimum values respectively obtained by subtracting the computation amount according to the proposal method from the computation amount according to the method B are presented by the following expressions (17) and (18) while R=P is set.

Additions: $24*P-M+1$ (17)

Multiplications: $12*P$ (18)

Therefore, in this case, the difference is positive both in the additions and the multiplications, and it is understood that the proposal method is superior to the method B in terms of the computation amount.

Figure 7:
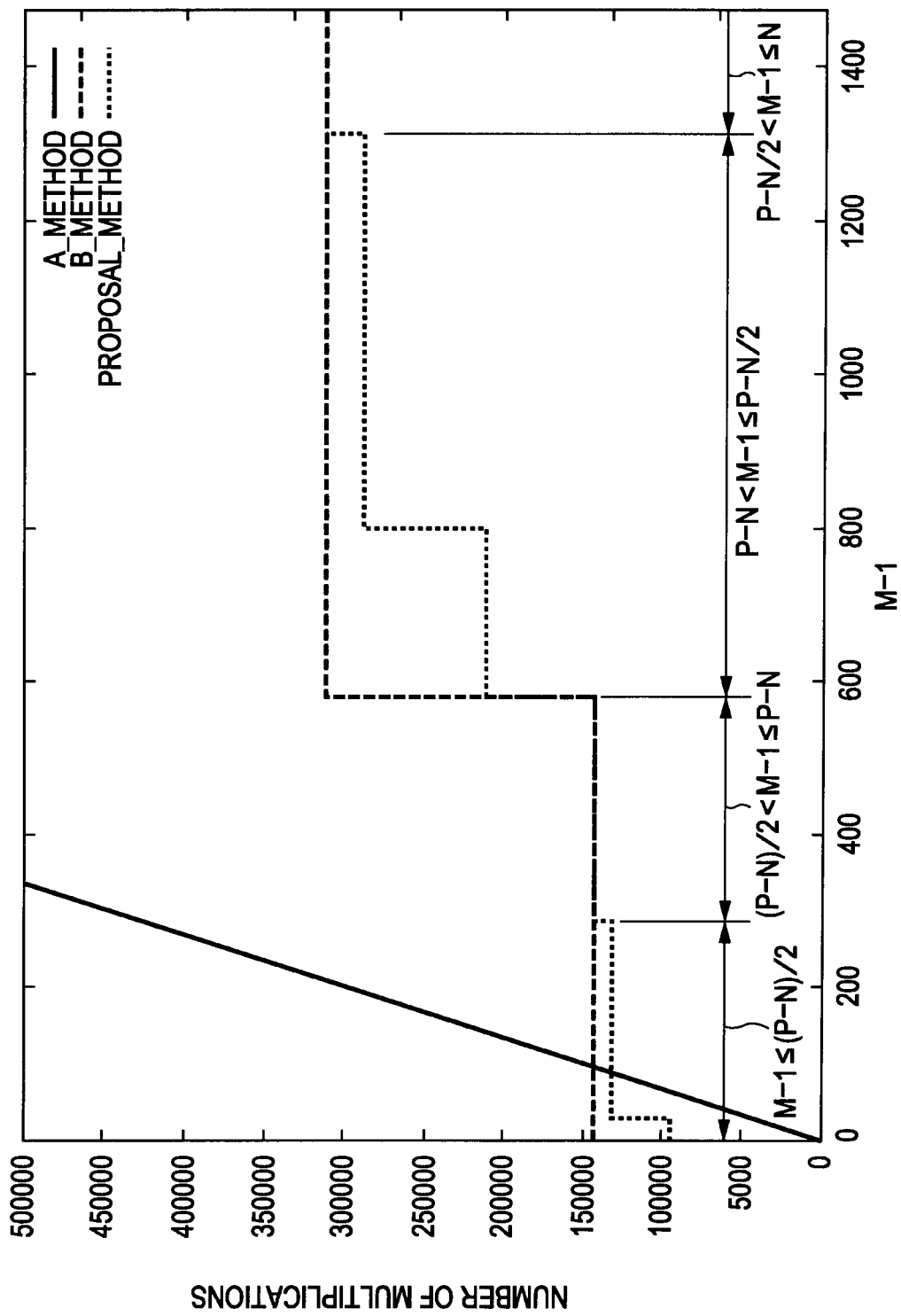
FIG. 7 is a graphic representation illustrating a comparison on the number of multiplications among the "method A" (A_Method), the "method B" (B_Method), the "proposal method" (Proposal_Method) in a case where M−1 is changed from 1 to N when N=1472.

Graphic representations of FIGS. 6 and 7 show, when N=1472, the number of additions and the number of multiplications according to the "method A" (A_Method), the "method B" (B_Method), the "proposal method" (Proposal_Method) are compared in a case where M−1 is changed from 1 to N. It should be however that the line for Proposal_Method in the drawing corresponds to the computation amount according to the method B in a range except for M−1≦(P−N)/2 and P−N<M−1≦P−N/2.

As will be understood from the graphic representations of FIGS. 6 and 7, in the ranges of M−1≦(P−N)/2 and P−N<M−1≦P−N/2, both the number of additions and the number of multiplications according to the proposal method (Proposal_Method) are smaller than those according to the method B (B_Method). Therefore, according to the proposal method, it is possible to compute with a smaller computation amount than that according to the method B.

<Comparison on Use Memory>

Due to restraints that the FFT processing value is held by way of a complex number according to the method B and the proposal method, a processing such as zero padding is performed, and the like, the use memory amount is larger than the method A. In the comparison between the method B and the proposal method, when the memory amount used for the method B is set as 1, the memory amount used for the proposal method is as follows.

A. In the case of M−1≦(P−N)/2 (the case of the filtering unit 100A of FIG. 2), the memory amount used for the proposal method is represented by the following expression (19).

$$(P+2*Q)/2*P \quad (19)$$

From the definition, as Q≦P/2 is established, the memory amount used for the proposal method is not increased as compared with the memory amount used for the method B. Here, P and Q are the same variables as those defined in the above.

B. In the case of P−N<M−1≦P−N/2 (the case of the filtering unit 100B of FIG. 4), the memory amount used for the proposal method is represented by the following expression (20).

$$(P+R)/2*P \quad (20)$$

From the definition, as R≦P is established, the proposal method used for the proposal method is not increased as compared with the memory amount used for the method B. Here, P and R are the same variables as those defined in the above.

As described above, in the surround processor 10 shown in FIG. 1, the respective filtering units are configured as the filtering unit 100A shown in FIG. 2 or the filtering unit 100B shown in FIG. 4. For that reason, as compared with the filtering unit configured to perform the computation processing according to the method B in related art, it is possible to reduce the computation amount and the memory use amount.

In the surround processor 10 shown in FIG. 1, when the respective filtering units have, for example, N=1472 and M=700, the calculation amounts according to the "method A", the "method B", the "proposal method" are as follows. Therefore, by using the proposal method, as compared with the related art method, it is possible to perform the convolution computation with the smaller computation amount.

"Method A"
  Additions: 12364800
  Multiplications: 12364800
"Method B"
  Additions: 7176192
  Multiplications: 3735552
"Proposal Method"
  Additions: 4800708
  Multiplications: 2506752

It should be noted that according to the above-mentioned embodiment, the respective filtering units of the surround processor 10 shown in FIG. 1 are configured as shown in the filtering unit 100A shown in FIG. 2 or the filtering unit 100B shown in FIG. 4.

2. Modified Examples

The filtering unit 100A shown in FIG. 2 is an example of a case where, as described above, when the minimum multiplier of 2 equal to or larger than N is set as P, N+M−1≦P is satisfied, and M−1≦(P−N)/2 is established. However, even in the case of (P−N)/2<M−1≦P−N, by dividing the discrete-time signal x[n] having the length of N (see FIG. 3A) into three to be processed, the computation amount can be reduced in some cases as compared with the method B. This reason will be described below.

FIG. 8 shows a configuration example of a filtering unit 100C in the above-mentioned case. The filtering unit 100C includes a three-way division unit 101C, a zero padding unit 102C, a fast Fourier transform unit 103C, a zero padding unit 104C, a fast Fourier transform unit 105C, a zero padding unit 106C, and a fast Fourier transform unit 107C. Also, the filtering unit 100C includes a padding unit 108C, a fast Fourier transform unit 109C, a zero padding unit 110C, and a fast Fourier transform unit 111C. Furthermore, the filtering unit 1000 includes a multiplication unit 112C, an inverse fast Fourier transform unit 113C, a multiplication unit 114C, an inverse fast Fourier transform unit 115C, a multiplication unit 116C, an inverse fast Fourier transform unit 117C, and an adder unit 118C.

Figure 9A:
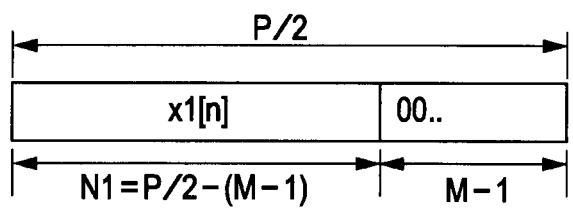
FIGS. 9A to 9C are explanatory diagrams for describing a state in which the discrete-time signal x[n] having the length of N is divided into three discrete-time signals and a filtering processing is performed.
Figure 9B:
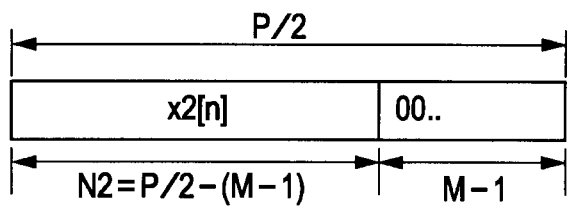
Figure 9C:
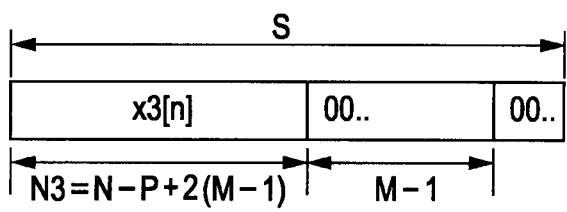

The three-way division unit 101C divides the discrete-time signal x[n] having the length of N (0≦n≦N−1) into three to obtain three discrete-time signals x1[n], x2[n], and x3[n]. Here, the length of N1 of x1[n] is set as P/2−(M−1) as shown in FIG. 9A. Also, the length of N2 of the discrete-time signal x2[n] is set as P/2−(M−1) as shown in FIG. 9B similar to the length of N1 of x1[n]. Also, the length of N3 of x3[n] is set as N−P+2(M−1) as shown in FIG. 9C.

The zero padding unit 102C pads (P/2−N1) pieces, that is, (M−1) pieces of zero after the discrete-time signal x1[n] having the length of N1 to obtain zero padded data x1'[n] having the length of P/2 (0≦n≦P/2−1). The fast Fourier transform unit 103C performs the FFT (fast Fourier transform) on the zero padded data x1'[n] obtained by the zero padding unit 102C to obtain frequency domain data X1[k] (0≦k≦P/2−1).

The zero padding unit 104C pads (P/2−N2) pieces, that is, (M−1) pieces of zero after the discrete-time signal x2[n] having the length of N2 to obtain zero padded data x2'[n] having the length of P/2 (0≦n≦P/2−1). The fast Fourier transform unit 105C performs the FFT (fast Fourier transform) on the zero padded data x2'[n] obtained by the zero padding unit 104C to obtain frequency domain data X2[k] (0≦k≦P/2−1).

The zero padding unit 106C pads (S−N3) pieces, that is, (S−(N−P+2(M−1)) pieces of zero after the discrete-time signal x3[n] having the length of N3 to obtain zero padded data x3'[n] (0≦n≦S−1) having a length S. Here, S is a minimum multiplier of 2 equal to or larger than N3+M−1. The fast Fourier transform unit 107C performs the FFT (fast Fourier transform) on the zero padded data x3'[n] obtained by the zero padding unit 106C to obtain frequency domain data X3[k] (0≦k≦S−1).

The zero padding unit 108C pads (P/2−M) pieces of zero after the filter coefficient h[m] having the length of M (0≦m≦M−1) to obtain zero padded data h12'[n] (0≦n≦P/2−1) having a length corresponding to the above-mentioned zero padded data x1'[n] and x2'[n]. The fast Fourier transform unit 109C performs the FFT (fast Fourier transform) on the zero padded data h12'[n] obtained by the zero padding unit 108C to obtain frequency domain data H12[k] (0≦k≦P/2−1).

The zero padding unit 110C pads (S−M) pieces of zero after the filter coefficient h[m] having the length of M (0≦m≦M−1) to obtain zero padded data h3'[n] (0≦n≦S−1) having a length corresponding to the above-mentioned zero padded data x3'[n] (0≦n≦S−1). The fast Fourier transform unit 111C performs the FFT (fast Fourier transform) on the zero padded data h3′[n] obtained by the zero padding unit 110C to obtain frequency domain data H3[k] ($0 \leq k \leq S-1$).

The multiplication unit 112C multiplies the frequency domain data X1[k] obtained by the fast Fourier transform unit 103C by the frequency domain data H12[k] obtained by the fast Fourier transform unit 109C to obtain a multiplication result Y1[k] ($0 \leq k \leq P/2-1$). Then, the inverse fast Fourier transform unit 113C performs the IFFT (inverse fast Fourier transform) on the multiplication result Y1[k] obtained by the multiplication unit 112C to obtain a discrete-time signal y1[n] ($0 \leq n \leq P/2-1$).

The multiplication unit 114C multiplies the frequency domain data X2[k] obtained by the fast Fourier transform unit 105C by the frequency domain data H12[k] obtained by the fast Fourier transform unit 109C to obtain a multiplication result Y2[k] ($0 \leq k \leq P/2-1$). Then, the inverse fast Fourier transform unit 115C performs the IFFT (inverse fast Fourier transform) on the multiplication result Y2[k] obtained by the multiplication unit 114C to obtain a discrete-time signal y2[n] ($0 \leq n \leq P/2-1$).

The multiplication unit 116C multiplies the frequency domain data X3[k] obtained by the fast Fourier transform unit 107C by the frequency domain data H3[k] obtained by the fast Fourier transform unit 111C to obtain a multiplication result Y3[k] ($0 \leq k \leq S-1$). Then, the inverse fast Fourier transform unit 117C performs the IFFT (inverse fast Fourier transform) on the multiplication result Y3[k] obtained by the multiplication unit 116C to obtain a discrete-time signal y3[n] ($0 \leq n \leq S-1$).

The adder unit 118C adds the discrete-time signals y1[n], y2[n], and y3[n] obtained by the inverse fast Fourier transform units 113C, 115C, and 117C to obtain an output discrete-time signal y[n]. The output discrete-time signal y[n] becomes a convolution computation result of the discrete-time signal x[n] and the filter coefficient h[m]. It should be noted that the adder unit 118C obtains the output discrete-time signal y[n] through the overlap-add method (see the above-mentioned document "DISCRETE-TIME SIGNAL PROCESSING") for ensuring the consistency with the case where the convolution computation of the discrete-time signal x[n] and the filter coefficient h[m] is performed without the division.

An operation of the filtering unit 100C of FIG. 8 will be described. The filtering target discrete-time signal having the length of N (discrete-time audio signal) x[n] is supplied to the three-way division unit 101C. In the three-way division unit 101C, the discrete-time signal x[n] having the length of N ($0 \leq n \leq N-1$) is divided into three. Then, from the three-way division unit 101C, the discrete-time signal x1[n] having the length of N1=P/2−(M−1) ($0 \leq n \leq N1-1$) is obtained. Also, from the three-way division unit 101C, the discrete-time signal x2[n] ($0 \leq n \leq N2-1$) having the length of N2=P/2−(M−1) is obtained. Also, from the three-way division unit 101C, the discrete-time signal x3[n] having the length of N3=N−P+2(M−1) ($0 \leq n \leq N3-1$) is obtained.

The discrete-time signal x1[n] obtained by the three-way division unit 101C is supplied to the zero padding unit 102C. In the zero padding unit 102C, after the discrete-time signal x1[n] having the length of N1, (M−1) pieces of zero are padded, and the zero padded data x1′[n] having the length (transform length) of P/2 is obtained. The zero padded data x1′[n] is supplied to the fast Fourier transform unit 103C. In the fast Fourier transform unit 103C, the FFT (fast Fourier transform) is performed on the zero padded data x1′[n], and the frequency domain data X1[k] ($0 \leq k \leq P/2-1$) is obtained.

Also, the discrete-time signal x2[n] obtained by the three-way division unit 101C is supplied to the zero padding unit 104C. In the zero padding unit 104C, after the discrete-time signal x2[n] having the length of N2, (M−1) pieces of zero are padded, and the zero padded data x2′[n] having the length (transform length) of P/2 is obtained. The zero padded data x2′[n] is supplied to the fast Fourier transform unit 105C. In the fast Fourier transform unit 105C, the FFT (fast Fourier transform) is performed on the zero padded data x2′[n], and the frequency domain data X2[k] ($0 \leq k \leq P/2-1$) is obtained.

Also, the discrete-time signal x3[n] obtained by the three-way division unit 101C is supplied to the zero padding unit 106C. In the zero padding unit 106C, after the discrete-time signal x3[n] having the length of N3, S−(N−P+2(M−1)) pieces of zero are padded, and the zero padded data x3′[n] having the length (transform length) of S is obtained. The zero padded data x3′[n] is supplied to the fast Fourier transform unit 107C. In the fast Fourier transform unit 107C, the FFT (fast Fourier transform) is performed on the zero padded data x3′[n], and the frequency domain data X3[k] ($0 \leq k \leq S-1$) is obtained.

Also, the filter coefficient h[m] having the length of M is supplied to the zero padding unit 108C. In the zero padding unit 108C, after the filter coefficient h[m] having the length of M, (P/2−M) pieces of zero are padded, and the zero padded data h12′[n] having the length (transform length) of P/2 is obtained. The zero padded data h12′[n] is supplied to the fast Fourier transform unit 109C. In the fast Fourier transform unit 109C, the FFT (fast Fourier transform) is performed on the zero padded data h12′[n], and the frequency domain data H12[k] is obtained.

Also, the filter coefficient h[m] having the length of M is supplied to the zero padding unit 110C. in the zero padding unit 110C, after the filter coefficient h[m] having the length of M, (S−M) pieces of zero are padded, and the zero padded data h3′[n] having the length (transform length) of S is obtained. The zero padded data h3′[n] is supplied to the fast Fourier transform unit 111C. In the fast Fourier transform unit 111C, the FFT (fast Fourier transform) is performed on the zero padded data h3′[n], and the frequency domain data H3[k] is obtained.

The frequency domain data X1[k] obtained by the fast Fourier transform unit 103C and the frequency domain data H12[k] obtained by the fast Fourier transform unit 109C are supplied to the multiplication unit 112C. In the multiplication unit 112C, the frequency domain data X1[k] is multiplied by the frequency domain data H12[k], and the multiplication result Y1[k] is obtained. The multiplication result Y1[k] is supplied to the inverse fast Fourier transform unit 113C. In the inverse fast Fourier transform unit 113C, the IFFT (inverse fast Fourier transform) is performed on the multiplication result Y1[k], and the discrete-time signal y1[n] is obtained.

Also, the frequency domain data X2[k] obtained by the fast Fourier transform unit 105C and the frequency domain data H12[k] obtained by the fast Fourier transform unit 109C are supplied to the multiplication unit 114C. In the multiplication unit 114C, the frequency domain data X2[k] is multiplied by the frequency domain data H12[k], and the multiplication result Y2[k] is obtained. The multiplication result Y2[k] is supplied to the inverse fast Fourier transform unit 115C. In the inverse fast Fourier transform unit 115C, the IFFT (inverse fast Fourier transform) is performed on the multiplication result Y2[k], and the discrete-time signal y2[n] is obtained.

Also, the frequency domain data X3[k] obtained by the fast Fourier transform unit 107C and the frequency domain data H3[k] obtained by the fast Fourier transform unit 111C are supplied to the multiplication unit 116C. In the multiplication unit 116C, the frequency domain data X3[k] is multiplied by the frequency domain data H3[k], and the multiplication result Y3[k] is obtained. The multiplication result Y3[k] is supplied to the inverse fast Fourier transform unit 117C. In the inverse fast Fourier transform unit 117C, the IFFT (inverse fast Fourier transform) is performed on the multiplication result Y3[k], and the discrete-time signal y3[n] is obtained.

The discrete-time signal y1[n] obtained by the inverse fast Fourier transform unit 113C, the discrete-time signal y2[n] obtained by the inverse fast Fourier transform unit 115C, and the discrete-time signal y3[n] obtained by the inverse fast Fourier transform unit 117C are supplied to the adder unit 118C. In the adder unit 118C, through the overlap-add method, the discrete-time signals y1[n], y2[n], and y3[n] are added, and the output discrete-time signal y[n] is obtained.

The filtering unit 100B shown in FIG. 4 is an example of a case where, as described above, when the minimum multiplier of 2 equal to or larger than N is set as P, N+M−1>P is satisfied, and P−N<M−1≦P−N/2 is established. However, even in the case of P−N/2<M−1≦N, by dividing the discrete-time signal x[n] having the length of N (see FIG. 5A) into three to be processed, the computation amount can be reduced in some cases as compared with the method B. This reason will be described below.

FIG. 10 shows a configuration example of a filtering unit 100D in the above-mentioned case. The filtering unit 100D includes a three-way division unit 101D, a zero padding unit 102D, a fast Fourier transform unit 103D, a zero padding unit 104D, a fast Fourier transform unit 105D, a zero padding unit 106D, and a fast Fourier transform unit 107D. Also, the filtering unit 100D includes a zero padding unit 108D, a fast Fourier transform unit 109D, a zero padding unit 110D, and a fast Fourier transform unit 111D. Furthermore, the filtering unit 100D includes a multiplication unit 112D, an inverse fast Fourier transform unit 113D, a multiplication unit 114D, an inverse fast Fourier transform unit 115D, a multiplication unit 116D, an inverse fast Fourier transform unit 117D, and an adder unit 118D.

Figure 11A:
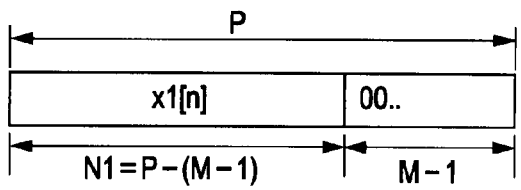
FIGS. 11A to 11C are explanatory diagrams for describing a state in which the discrete-time signal x[n] having the length of N is divided into three discrete-time signals and a filtering processing is performed.
Figure 11B:
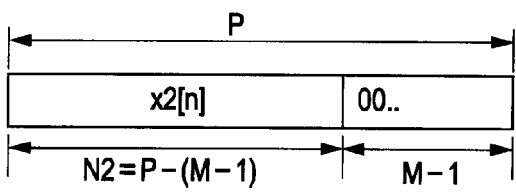
Figure 11C:
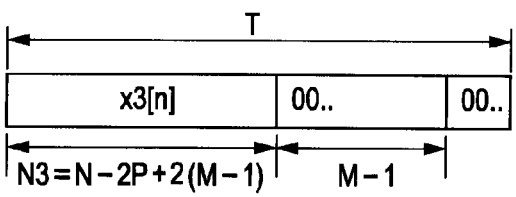

The three-way division unit 101D divides the discrete-time signal x[n] having the length of N (0≦n≦N−1) into three to obtain three discrete-time signals x1[n], x2[n], and x3[n]. Here, the length of N1 of x1[n] is set as P−(M−1) as shown in FIG. 11A. Also, the length of N2 of the discrete-time signal x2[n] is set as P−(M−1) as shown in FIG. 11B similar to the length of N1 of x1[n]. Also, the length of N3 of x3[n] is set as N−2P+2(M−1) as shown in FIG. 11C.

The zero padding unit 102D pads (P−N1) pieces, that is, (M−1) pieces of zero after the discrete-time signal x1[n] having the length of N1 to obtain the zero padded data x1'[n] having the length of P (0≦n≦P−1). The fast Fourier transform unit 103D performs the FFT (fast Fourier transform) on the zero padded data x1'[n] obtained by the zero padding unit 102D to obtain the frequency domain data X1[k] (0≦k≦P−1).

The zero padding unit 104D pads (P−N2) pieces, that is, (M−1) pieces of zero after the discrete-time signal x2[n] having the length of N2 to obtain the zero padded data x2'[n] having the length of P (0≦n≦P−1). The fast Fourier transform unit 105D performs the FFT (fast Fourier transform) on the zero padded data x2'[n] obtained by the zero padding unit 104D to obtain the frequency domain data X2[k] (0≦k≦P−1).

The zero padding unit 106D pads (T−N3) pieces, that is, (T−(N−2P+2(M−1))) pieces of zero after the discrete-time signal x3[n] having the length of N3 to obtain the zero padded data x3'[n] having a length of T (0≦n≦T−1). Here, T is a minimum multiplier of 2 equal to or larger than N3+M−1. The fast Fourier transform unit 107D performs the FFT (fast Fourier transform) on the zero padded data x3'[n] obtained by the zero padding unit 106D to obtain the frequency domain data X3[k] (0≦k≦T−1).

The zero padding unit 108D pads (P−M) pieces of zero after the filter coefficient h[m] having the length of M (0≦m≦M−1) to obtain the zero padded data h12'[n] (0≦n≦P−1) having a length corresponding to the above-mentioned zero padded data x1'[n] and x2'[n]. The fast Fourier transform unit 109D performs the FFT (fast Fourier transform) on the zero padded data h12'[n] obtained by the zero padding unit 108D to obtain the frequency domain data H12[k] (0≦k≦P−1).

The zero padding unit 110D pads (T−M) pieces of zero after the filter coefficient h[m] having the length of M (0≦m≦M−1) to obtain the zero padded data h3'[n] (0≦n≦T−1) having a length corresponding to the above-mentioned zero padded data x3'[n] (0≦n≦T−1). The fast Fourier transform unit 111D performs the FFT (fast Fourier transform) on the zero padded data h3'[n] obtained by the zero padding unit 110D to obtain the frequency domain data H3[k] (0≦k≦T−1).

The multiplication unit 112D multiplies the frequency domain data X1[k] obtained by the fast Fourier transform unit 103D by the frequency domain data H12[k] obtained by the fast Fourier transform unit 109D to obtain the multiplication result Y1[k] (0≦k≦P−1). Then, the inverse fast Fourier transform unit 113D performs the IFFT (inverse fast Fourier transform) on the multiplication result Y1[k] obtained by the multiplication unit 112D to obtain the discrete-time signal y1[n] (0≦n≦P−1).

The multiplication unit 114D multiplies the frequency domain data X2[k] obtained by the fast Fourier transform unit 105D by the frequency domain data H12[k] obtained by the fast Fourier transform unit 109D to obtain the multiplication result Y2[k] (0≦k≦P−1). Then, the inverse fast Fourier transform unit 115D performs the IFFT (inverse fast Fourier transform) on the multiplication result Y2[k] obtained by the multiplication unit 114D to obtain the discrete-time signal y2[n] (0≦n≦P−1).

The multiplication unit 116D multiplies the frequency domain data X3[k] obtained by the fast Fourier transform unit 107D by the frequency domain data H3[k] obtained by the fast Fourier transform unit 111D to obtain the multiplication result Y3[k] (0≦k≦T−1). Then, the inverse fast Fourier transform unit 117D performs the IFFT (inverse fast Fourier transform) on the multiplication result Y3[k] obtained by the multiplication unit 116D to obtain the discrete-time signal y3[n] (0≦n≦T−1).

The adder unit 118D adds the discrete-time signals y1[n], y2[n], and y3[n] obtained by the inverse fast Fourier transform units 113D, 115D, and 117D to obtain an output discrete-time signal y[n]. The output discrete-time signal y[n] becomes a convolution computation result of the discrete-time signal x[n] and the filter coefficient h[m]. It should be noted that the adder unit 118D obtains the output discrete-time signal y[n] through the overlap-add method (see the above-mentioned document "DISCRETE-TIME SIGNAL PROCESSING") for ensuring the consistency with the case where the convolution computation of the discrete-time signal x[n] and the filter coefficient h[m] is performed without the division.

An operation of the filtering unit 100D of FIG. 10 will be described. The filtering target discrete-time signal having the length of N (discrete-time audio signal) x[n] is supplied to the three-way division unit 101D. In the three-way division unit 101D, the discrete-time signal x[n] having the length of N (0≦n≦N−1) is divided into three. Then, from the three-way division unit 101D, the discrete-time signal x1[n] (0≦n≦N1−1) having the length of N1=P−(M−1) is obtained. Also, from the three-way division unit 101D, the discrete-time signal x2[n] (0≦n≦N2−1) having the length of N2=P−(M−1) is obtained. Also, from the three-way division unit 101D, the discrete-time signal x3[n] (0≦n≦N3−1) having the length of N3=N−2P+2(M−1) is obtained.

The discrete-time signal x1[n] obtained by the three-way division unit 101D is supplied to the zero padding unit 102D. In the zero padding unit 102D, after the discrete-time signal x1[n] having the length of N1, (M−1) pieces of zero are padded, and the zero padded data x1'[n] having the length (transform length) of P is obtained. The zero padded data x1'[n] is supplied to the fast Fourier transform unit 103D. In the fast Fourier transform unit 103D, the FFT (fast Fourier transform) is performed on the zero padded data x1'[n], and the frequency domain data X1[k] (0≦k≦P−1) is obtained.

Also, the discrete-time signal x2[n] obtained by the three-way division unit 101D is supplied to the zero padding unit 104D. In the zero padding unit 104D, after the discrete-time signal x2[n] having the length of N2, (M−1) pieces of zero are padded, and the zero padded data x2'[n] having the length (transform length) of P is obtained. The zero padded data x2'[n] is supplied to the fast Fourier transform unit 105D. In the fast Fourier transform unit 105D, the FFT (fast Fourier transform) is performed on the zero padded data x2'[n], and the frequency domain data X2[k] (0≦k≦P−1) is obtained.

Also, the discrete-time signal x3[n] obtained by the three-way division unit 101D is supplied to the zero padding unit 106D. In the zero padding unit 106D, after the discrete-time signal x3[n] having the length of N3, T−(N−2P+2(M−1)) pieces of zero are padded, and the zero padded data x3'[n] having the length (transform length) of T is obtained. The zero padded data x3'[n] is supplied to the fast Fourier transform unit 107D. In the fast Fourier transform unit 107D, the FFT (fast Fourier transform) is performed on the zero padded data x3'[n], and the frequency domain data X3[k] (0≦k≦T−1) is obtained.

Also, the filter coefficient h[m] having the length of M is supplied to the zero padding unit 108D. In the zero padding unit 108D, after the filter coefficient h[m] having the length of M, (P−M) pieces of zero are padded, and the zero padded data h12'[n] having the length (transform length) of P is obtained. The zero padded data h12'[n] is supplied to the fast Fourier transform unit 109D. In the fast Fourier transform unit 109D, the FFT (fast Fourier transform) is performed on the zero padded data h12'[n], and the frequency domain data H12[k] is obtained.

Also, the filter coefficient h[m] having the length of M is supplied to the zero padding unit 110D. In the zero padding unit 110D, after the filter coefficient h[m] having the length of M, (T−M) pieces of zero are padded, and the zero padded data h3'[n] having the length (transform length) of T is obtained. The zero padded data h3'[n] is supplied to the fast Fourier transform unit 111D. In the fast Fourier transform unit 111D, the FFT (fast Fourier transform) is performed on the zero padded data h3'[n], and the frequency domain data H3[k] is obtained.

The frequency domain data X1[k] obtained by the fast Fourier transform unit 103D and the frequency domain data H12[k] obtained by the fast Fourier transform unit 109D are supplied to the multiplication unit 112D. In the multiplication unit 112D, the frequency domain data X1[k] is multiplied by the frequency domain data H12[k], and the multiplication result Y1[k] is obtained. The multiplication result Y1[k] is supplied to the inverse fast Fourier transform unit 113D. In the inverse fast Fourier transform unit 113D, the IFFT (inverse fast Fourier transform) is performed on the multiplication result Y1[k], and the discrete-time signal y1[n] is obtained.

Also, the frequency domain data X2[k] obtained by the fast Fourier transform unit 105D and the frequency domain data H12[k] obtained by the fast Fourier transform unit 109D are supplied to the multiplication unit 114D. In the multiplication unit 114D, the frequency domain data X2[k] is multiplied by the frequency domain data H12[k], and the multiplication result Y2[k] is obtained. The multiplication result Y2[k] is supplied to the inverse fast Fourier transform unit 115D. In the inverse fast Fourier transform unit 115D, the IFFT (inverse fast Fourier transform) is performed on the multiplication result Y2[k], and the discrete-time signal y2[n] is obtained.

Also, the frequency domain data X3[k] obtained by the fast Fourier transform unit 107D and the frequency domain data H3[k] obtained by the fast Fourier transform unit 111D are supplied to the multiplication unit 116D. In the multiplication unit 116D, the frequency domain data X3[k] is multiplied by the frequency domain data H3[k], and the multiplication result Y3[k] is obtained. The multiplication result Y3[k] is supplied to the inverse fast Fourier transform unit 117D. In the inverse fast Fourier transform unit 117D, the IFFT (inverse fast Fourier transform) is performed on the multiplication result Y3[k], and the discrete-time signal y3[n] is obtained.

The discrete-time signal y1[n] obtained by the inverse fast Fourier transform unit 113D, the discrete-time signal y2[n] obtained by the inverse fast Fourier transform unit 115D, and the discrete-time signal y3[n] obtained by the inverse fast Fourier transform unit 117D are supplied to the adder unit 118D. In the adder unit 118D, through the overlap-add method, the discrete-time signals y1[n], y2[n], and y3[n] are added, and the output discrete-time signal y[n] is obtained.

[Case where Computation Amount can be Reduce]

In the filtering units 100C and 100D of FIGS. 8 and 10, a case where the computation amount can be reduced as compared with the method B will be described.

Here, the computation amounts are compared between the "method B" and the method of dividing x[n] as shown in FIGS. 8 and 10 (hereinafter, which will be referred to as "proposal method").

"Comparison on Computation Amount"

<Conditions for Comparison>

In this comparison, the numbers of additions and multiplications are simply compared.

With regard to the computation amount of the FFT, a cosine value and a sine value of the complex exponential function (see expression (21)) of the butterfly computation unit are held as data, and the numbers of additions and multiplications are evaluated only regarding the additions of the butterfly computation unit and the multiplications of the addition result and the complex exponential function.

$$W_N^k = eqp\left(\frac{-j2\pi k}{N}\right) = \cos\left(\frac{2\pi k}{N}\right) - j\sin\left(\frac{2\pi k}{N}\right) \quad (21)$$

It should be noted that P, S, and T can be calculated by the following expressions.

P=2**int(log 2(N*2−1))

S=2**int(log 2((N+3*M−3−P)*2−1))

T=2**int(log 2((N+3*M−3−2*P)*2−1))

It should be however that int(x) denotes an integer x whose fractional part is cut off, and log 2(x) denotes a logarithm to the base 2.

<Calculation Results of Computation Amount>

The calculation results of the computation amount according to the "method B" and the "proposal method" are shown below. It should be noted that expressions (22) to (25) representing the calculation results of the computation amount according to the "method B" are the same as the above-mentioned expressions (7) to (10) but shown for facilitating the comparison.

"Method B"

In the case of M−1≦P−N, the following expressions (22) and (23) represent the results.

$$\text{Additions: } 12*P*\log 2(P)+2*P \quad (22)$$

$$\text{Multiplications: } 6*P*\log 2(P)+4*P \quad (23)$$

In the case of P−N<M−1≦N, the following expressions (24) and (25) represent the results.

$$\text{Additions: } 24*P*\log 2(P)+28*P \quad (24)$$

$$\text{Multiplications: } 12*P*\log 2(P)+20*P \quad (25)$$

"Proposal Method"

A. In a case where x[n] is divided into three by (P−N)/2<M−1≦P−N (in the case of the filtering unit 100C of FIG. 8), the following expressions (26) and (27) represent the results.

$$\text{Additions: } 10*P*\log 2(P)-8*P+12*S*\log 2(S)+2*S+2*(M-1) \quad (26)$$

$$\text{Multiplications: } 5*P*\log 2(P)-P+6*S*\log 2(S)+4*S \quad (27)$$

B. In a case where x[n] is divided into three by P−N/2<M−1≦N (in the case of the filtering unit 100D of FIG. 10), the following expressions (28) and (29) represent the results.

$$\text{Additions: } 20*P*\log 2(P)+4*P+12*T*\log 2(T)+2*T+2*(M-1) \quad (28)$$

$$\text{Multiplications: } 10*P*\log 2(P)+8*P+6*T*\log 2(T)+4*T \quad (29)$$

<Difference of Computation Amounts Between Method B and Proposal Method>

A. In the case of (P−N)/2<M−1≦P−N (the case of the filtering unit 100C in FIG. 8), the minimum values respectively obtained by subtracting the computation amount according to the proposal method from the computation amount according to the method B are represented by the following expressions (30) and (31).

$$\text{Additions: } 2*P*\log 2(P)+10*P-12*S*\log 2(S)-2*S-2*(M-1) \quad (30)$$

$$\text{Multiplications: } P*\log 2(P)+5*P-6*S*\log 2(S)-4*S \quad (31)$$

Therefore, in this case, when the values of the expressions (30) and (31) are positive depending on the values of N and M, the proposal method is superior to the method B in terms of the computation amount.

B. In the case of P−N/2<M−1≦N (the case of the filtering unit 100D of FIG. 10), the minimum values respectively obtained by subtracting the computation amount according to the proposal method from the computation amount according to the method B are represented by the following expressions (32) and (33).

$$\text{Additions: } 4*P*\log 2(P)+24*P-12*T*\log 2(T)-2*T-2*(M-1) \quad (32)$$

$$\text{Multiplications: } 2*P*\log 2(P)+12*P-6*T*\log 2(T)-4*T \quad (33)$$

Therefore, when the values of the expressions (32) and (33) are positive depending on the values of N and M, the proposal method is superior to the method B in terms of the computation amount.

It should be noted that in the above-mentioned filtering units of FIGS. 2, 4, 8 and 10, the discrete-time signal x[n] having the length of N (N is an integer) is divided into two or three to be processed. However, according to the embodiment of the present invention, the number of divisions and the manner of the divisions are not limited to these division examples. To elaborate, a gist of the embodiment of the present invention is that when the output is obtained in a case where the discrete-time signal having the length of N (N is an integer) is input to the FIR filter with the filter coefficient having the length of M (M is an integer, N≧M−1), the discrete-time signal x[n] having the length of N is divided into a plurality of discrete-time signals to be processed. With this configuration, as compared with the related art method, the computation amount and the like can be reduced.

Figure 12:
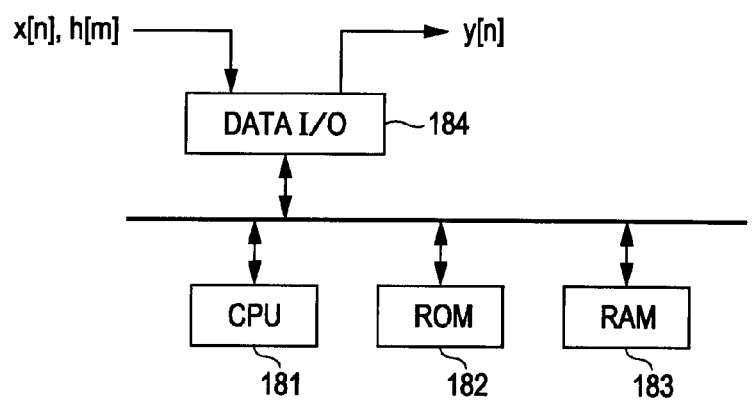
FIG. 12 is a block diagram of a configuration example of a computer apparatus in which a filtering processing (convolution computation of the discrete-time signal and a filter coefficient) is performed by using software.
Figure 14A:
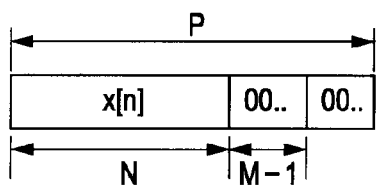
FIG. 14 is an explanatory diagram for describing a transform length in a case where the convolution computation of the discrete-time signal and the filter coefficient is performed by using fast Fourier transform through multiplication in the frequency domain.
Figure 14B:
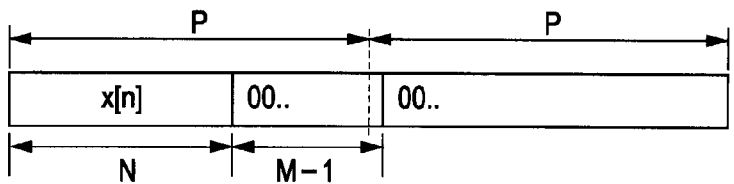

Also, the filtering units 100A to 100D described above are configured to perform the processing by way of hardware, but a similar processing can also be performed by way of software. FIG. 12 shows a configuration example of a computer apparatus 100E configured to perform the processing by way of software. The computer apparatus 100E is composed of a CPU (Central Processing Unit) 181, a ROM (Read Only Memory) 182, a RAM (Random Access Memory) 183, and data input and output unit (data I/O) 184.

The ROM 182 stores a processing program for the CPU 181. The RAM 183 functions as a work area of the CPU 181. The CPU 181 reads out the processing program stored in the ROM 182 as the occasion occurs, transfers the read processing program to the RAM 183 to be expanded, reads out the expanded processing program, and executes the filtering processing.

In the computer apparatus 100E, the discrete-time signal x[n] having the length of N and the filter coefficient h[m] having the length of M are input via the data I/O 184 to be accumulated in the RAM 183. The convolution computation processing in a similar procedure by the above-mentioned filtering units of FIGS. 2, 4, 8, and 10, that is, the filtering processing is performed on the discrete-time signal x[n] and the filter coefficient h[m] accumulated in the RAM 183 by the CPU 181. The output discrete-time signal y[n] after the processing is output to the outside from the RAM 183 to the data I/O 184.

Also, according to the above-mentioned embodiment, the embodiment of the present invention is applied to the respective filtering units of the surround processor 10. However, the embodiment of the present invention can of course be similarly applied to another filtering apparatus configured to perform the convolution computation of the discrete-time signal and the filter coefficient by using the fast Fourier transform through the multiplication in the frequency domain.

The present application contains subject matter related to that disclosed in Japanese Priority Patent Application JP 2009-060442 filed in the Japan Patent Office on Mar. 13, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A filtering apparatus configured to obtain an output in a case where a discrete-time signal having a length of N (N is an integer) is input to an FIR filter with a filter coefficient having a length of M (M is an integer, N≧M−1), the filtering apparatus comprising:
a division unit configured to divide the discrete-time signal having the length of N into a plurality of signals and obtain a plurality of discrete-time signals;
a first zero padding unit configured to pad an appropriate number of zero after the respective discrete-time signals obtained by the division unit and obtain a plurality of pieces of zero padded data having a length of a multiplier of 2;
a first fast Fourier transform unit configured to perform a fast Fourier transform on the respective pieces of zero padded data obtained by the first zero padding unit and obtain a plurality of pieces of frequency domain data;
a second zero padding unit configured to pad zero after the filter coefficient having the length of M and obtain a plurality of pieces of zero padded data having a length corresponding to the respective pieces of zero padded data obtained by the first zero padding unit;
a second fast Fourier transform unit configured to perform a fast Fourier transform on the respective pieces of zero padded data obtained by the second zero padding unit and obtain a plurality of pieces of frequency domain data;
a multiplication unit configured to multiply the respective pieces of frequency domain data obtained by the first fast Fourier transform unit by the respective pieces of frequency domain data obtained by the second fast Fourier transform unit and obtain a plurality of multiplication results;
an inverse fast Fourier transform unit configured to perform inverse fast Fourier transform on the respective multiplication results obtained by the multiplication unit and obtain a plurality of discrete-time signals; and
an adder unit configured to add the respective discrete-time signals obtained by the inverse fast Fourier transform unit and obtain an output discrete-time signal,
wherein the division unit divides the discrete-time signal having the length of N into two and obtains two discrete-time signals,
wherein when the length of the multiplier of 2 equal to or larger than (N+M−1) is set as L, the first zero padding unit obtains a zero padded data having a length of L/2 and a zero padded data having a length equal to or smaller than L/2,
wherein when a minimum multiplier of 2 equal to or larger than the N is set as P, the N and the M satisfy M−1≦(P−N)/2, and
wherein the division unit divides the discrete-time signal having the length of N into a discrete-time signal having a length of (P/2−(M−1)) and a discrete-time signal having a length of (N−P/2+(M−1)).

2. The filtering apparatus according to claim 1,
wherein when a minimum multiplier of 2 equal to or larger than the N is set as P, the N and the M satisfy P−N<M−1≦P−N/2, and
the division unit divides the discrete-time signal having the length of N into a discrete-time signal having a length of (P−(M−1)) and a discrete-time signal having a length of (N−P+(M−1)).

3. A filtering method, performed by a microprocessor, for obtaining an output in a case where a discrete-time signal having a length of N (N is an integer) is input to an FIR filter with a filter coefficient having a length of M (M is an integer, N≧M−1), the filtering method comprising the steps of:
dividing the discrete-time signal having the length of N into a plurality of signals and obtain a plurality of discrete-time signals;
firstly padding at least (M−1) pieces of zero after the respective discrete-time signals obtained in the dividing step and obtaining a plurality of pieces of zero padded data having a length of a multiplier of 2;
firstly performing a fast Fourier transform on the respective pieces of zero padded data obtained in the first zero padding step and obtaining a plurality of pieces of frequency domain data;
secondly padding zero after the filter coefficient having the length of M and obtaining a plurality of pieces of zero padded data having a length corresponding to the respective pieces of zero padded data obtained in the first zero padding step;
secondly performing a fast Fourier transform on the respective pieces of zero padded data obtained in the second zero padding step and obtaining a plurality of pieces of frequency domain data;
multiplying the respective pieces of frequency domain data obtained in the first fast Fourier transform step by the respective pieces of frequency domain data obtained in the second fast Fourier transform step and obtaining a plurality of multiplication results;
performing an inverse fast Fourier transform on the respective multiplication results obtained in the multiplying step and obtaining a plurality of discrete-time signals; and
adding the respective discrete-time signals obtained in the inverse fast Fourier transform step and obtaining an output discrete-time signal,
wherein the dividing step comprises dividing the discrete-time signal having the length of N into two and obtains two discrete-time signals,
wherein when the length of the multiplier of 2 equal to or larger than (N+M−1) is set as L, a zero padded data is obtained having a length of L/2 and a zero padded data having a length equal to or smaller than L/2,
wherein when a minimum multiplier of 2 equal to or larger than the N is set as P, the N and the M satisfy M−1≦(P−N)/2, and
wherein the dividing step further comprises dividing the discrete-time signal having the length of N into a discrete-time signal having a length of (P/2−(M−1)) and a discrete-time signal having a length of (N−P/2+(M−1)).

4. A non-transitory, computer-readable medium comprising instructions for obtaining an output in a case where a discrete-time signal having a length of N (N is an integer) is input to an FIR filter with a filter coefficient having a length of M (M is an integer, N≧M−1), the program instructing a computer to function as:
division means configured to divide the discrete-time signal having the length of N into a plurality of signals and obtain a plurality of discrete-time signals;
first zero padding means configured to pad at least (M−1) pieces of zero after the respective discrete-time signals obtained by the division means and obtain a plurality of pieces of zero padded data having a length of a multiplier of 2;
first fast Fourier transform means configured to perform a fast Fourier transform on the respective pieces of zero padded data obtained by the first zero padding means and obtain a plurality of pieces of frequency domain data;

second zero padding means configured to pad zero after the filter coefficient having the length of M and obtain a plurality of pieces of zero padded data having a length corresponding to the respective pieces of zero padded data obtained by the first zero padding means;

second fast Fourier transform means configured to perform a fast Fourier transform on the respective pieces of zero padded data obtained by the second zero padding means and obtain a plurality of pieces of frequency domain data;

multiplication means configured to multiplying the respective pieces of frequency domain data obtained by the first fast Fourier transform means by the respective pieces of frequency domain data obtained by the second fast Fourier transform means and obtain a plurality of multiplication results;

inverse fast Fourier transform means configured to perform an inverse fast Fourier transform on the respective multiplication results obtained by the multiplication means and obtain a plurality of discrete-time signals; and adder means configured to add the respective discrete-time signals obtained by the inverse fast Fourier transform means and obtain an output discrete-time signal, wherein the division means divides the discrete-time signal having the length of N into two and obtains two discrete-time signals, wherein when the length of the multiplier of 2 equal to or larger than (N+M−1) is set as L, a zero padded data is obtained having a length of L/2 and a zero padded data having a length equal to or smaller than L/2, wherein when a minimum multiplier of 2 equal to or larger than the N is set as P, the N and the M satisfy M−1≦(P−N)/2, and wherein the division means divides the discrete-time signal having the length of N into a discrete-time signal having a length of (P/2−(M−1)) and a discrete-time signal having a length of (N−P/2+(M−1)).

5. A surround processor provided with a plurality of filtering units configured to obtain an output in a case where a discrete-time signal having a length of N (N is an integer) is input to an FIR filter with a filter coefficient having a length of M (M is an integer, N≧M−1) and configured to generate two-channel discrete-time audio signals from discrete-time audio signals having at least three channels, the filtering unit comprising:

a division unit configured to divide the discrete-time audio signal having the length of N into a plurality of signals and obtain a plurality of discrete-time audio signals;

a first zero padding unit configured to pad at least (M−1) pieces of zero after the respective discrete-time audio signals obtained by the division unit and obtain a plurality of pieces of zero padded data having a length of a multiplier of 2;

a first fast Fourier transform unit configured to perform a fast Fourier transform on the respective pieces of zero padded data obtained by the first zero padding unit and obtain a plurality of pieces of frequency domain data;

a second zero padding unit configured to pad zero after the filter coefficient having the length of M and obtain a plurality of pieces of zero padded data having a length corresponding to the respective pieces of zero padded data obtained by the first zero padding unit;

a second fast Fourier transform unit configured to perform a fast Fourier transform on the respective pieces of zero padded data obtained by the second zero padding unit and obtain a plurality of pieces of frequency domain data;

a multiplication unit configured to multiply the respective pieces of frequency domain data obtained by the first fast Fourier transform unit by the respective pieces of frequency domain data obtained by the second fast Fourier transform unit and obtain a plurality of multiplication results;

an inverse fast Fourier transform unit configured to perform an inverse fast Fourier transform on the respective multiplication results obtained by the multiplication unit and obtain a plurality of discrete-time audio signals; and an adder unit configured to add the respective discrete-time audio signals obtained by the inverse fast Fourier transform unit and obtain an output discrete-time signal, wherein the division unit divides the discrete-time signal having the length of N into two and obtains two discrete-time signals, wherein when the length of the multiplier of 2 equal to or larger than (N+M−1) is set as L, the first zero padding unit obtains a zero padded data having a length of L/2 and a zero padded data having a length equal to or smaller than L/2, wherein when a minimum multiplier of 2 equal to or larger than the N is set as P, the N and the M satisfy M−1≧(P−N)/2, and wherein the division unit divides the discrete-time signal having the length of N into a discrete-time signal having a length of (P/2−(M−1)) and a discrete-time signal having a length of (N−P/2+(M−1)).

* * * * *